(12) United States Patent
Lahnor et al.

(10) Patent No.: US 7,776,759 B2
(45) Date of Patent: Aug. 17, 2010

(54) METHODS FOR FORMING AN INTEGRATED CIRCUIT, INCLUDING OPENINGS IN A MOLD LAYER FROM NANOWIRES OR NANOTUBES

(75) Inventors: Peter Lahnor, Dresden (DE); Odo Wunnicke, Dresden (DE); Johannes Heitmann, Dresden (DE); Peter Moll, Dresden (DE); Andreas Orth, Dresden (DE)

(73) Assignee: Qimonda AG, Munich (DE)

( * ) Notice: Subject to any disclaimer, the term of this patent is extended or adjusted under 35 U.S.C. 154(b) by 322 days.

(21) Appl. No.: 11/687,426

(22) Filed: Mar. 16, 2007

(65) Prior Publication Data

US 2007/0286945 A1 Dec. 13, 2007

(30) Foreign Application Priority Data

Mar. 22, 2006 (DE) .................... 10 2006 013 245

(51) Int. Cl.
*B82B 1/00* (2006.01)
*H01L 29/92* (2006.01)
*B82B 3/00* (2006.01)

(52) U.S. Cl. ............... 438/758; 438/386; 257/E21.001; 977/700; 977/720

(58) Field of Classification Search ............... 438/758, 438/386, 584; 257/E21.001; 977/700, 720, 977/721, 762, 810, 811, 813, 936
See application file for complete search history.

(56) References Cited

U.S. PATENT DOCUMENTS

| 2004/0043208 | A1* | 3/2004 | Fukutani et al. | 428/304.4 |
| 2005/0276093 | A1 | 12/2005 | Graham et al. | |
| 2006/0032526 | A1 | 2/2006 | Fukutani et al. | |
| 2006/0212975 | A1* | 9/2006 | Choi et al. | 977/810 |
| 2007/0105356 | A1* | 5/2007 | Wu et al. | 438/584 |
| 2008/0003768 | A1* | 1/2008 | Oh | 438/399 |

OTHER PUBLICATIONS

Jung Sang Suh et al., "Highly Ordered Two-Dimensional Carbon Nanotube Arrays", Applied Physics Letters, vol. 75, No. 14, Oct. 4, 1999 (3 pgs.).

* cited by examiner

*Primary Examiner*—Matthew Smith
*Assistant Examiner*—Michele Fan
(74) *Attorney, Agent, or Firm*—Dicke, Billig & Czaja, PLLC

(57) ABSTRACT

A method for forming an integrated circuit having openings in a mold layer and for producing capacitors is disclosed. In one embodiment, nanotubes or nanowires are grown vertically on a horizontal substrate surface. The nanotubes or nanowires serve as a template for forming openings in a mold layer. The substrate is covered with a mold material after the formation of the nanowires or nanotubes. One embodiment provides mold layers having openings with a much higher aspect ratio.

20 Claims, 25 Drawing Sheets

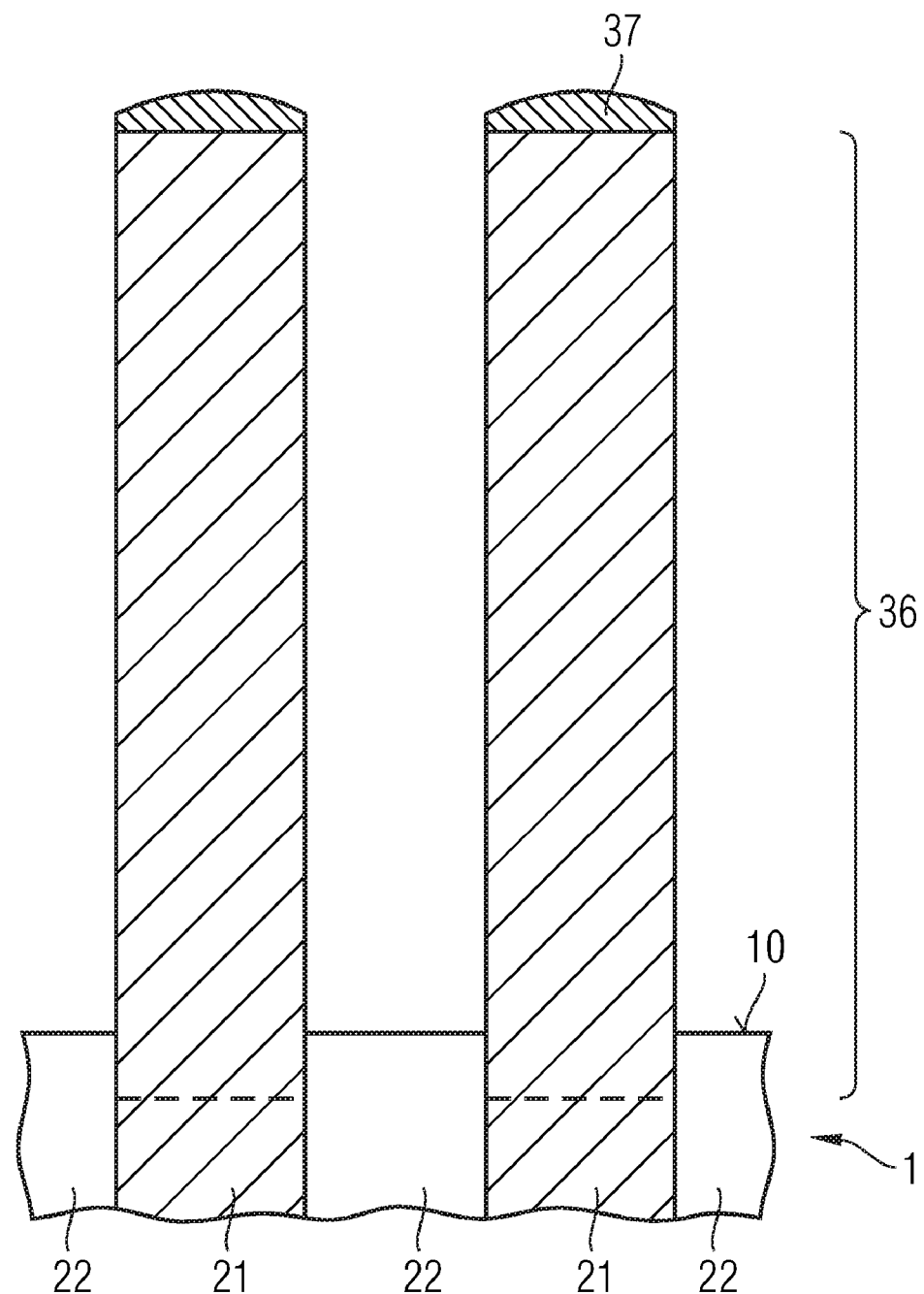

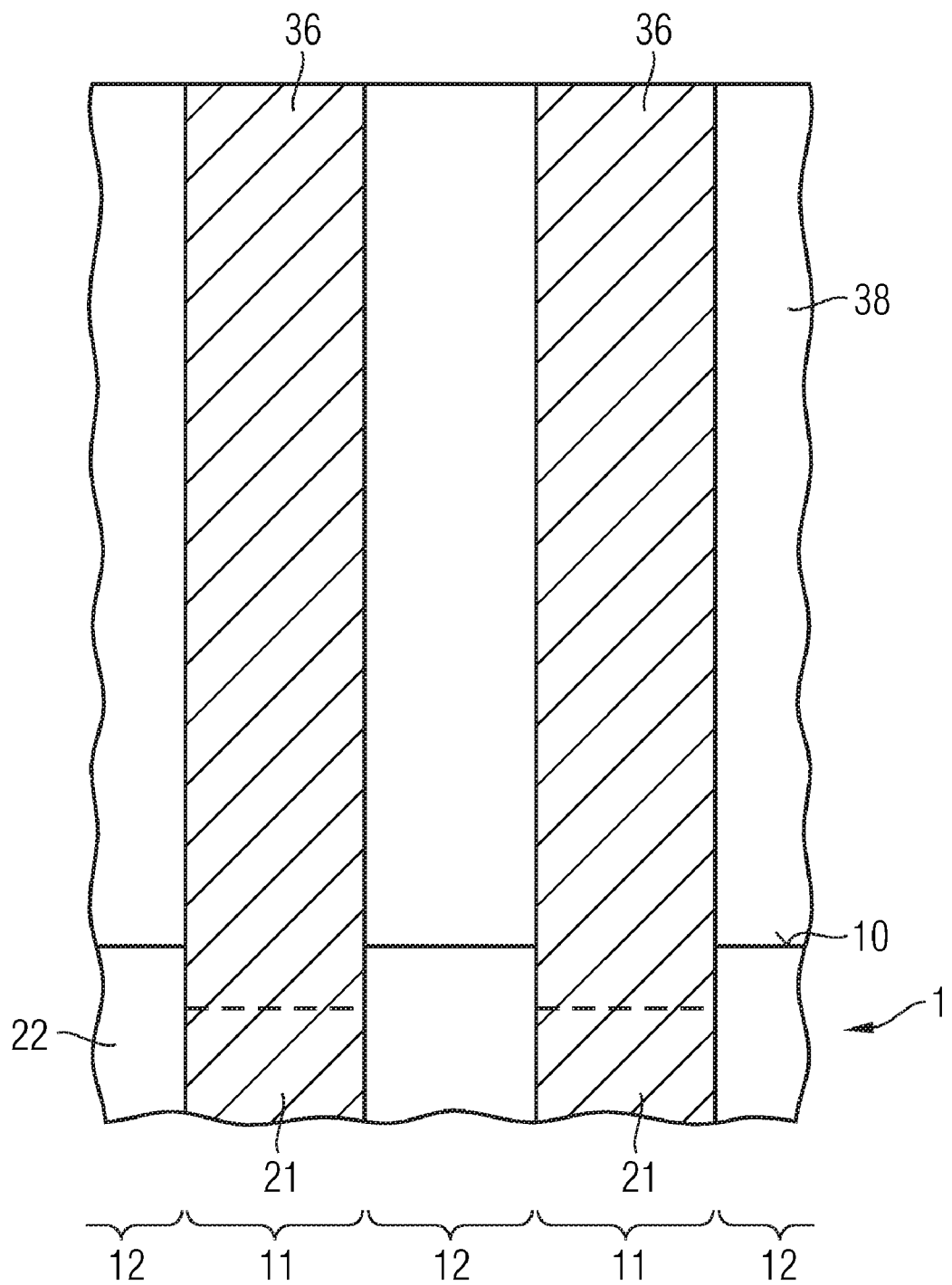

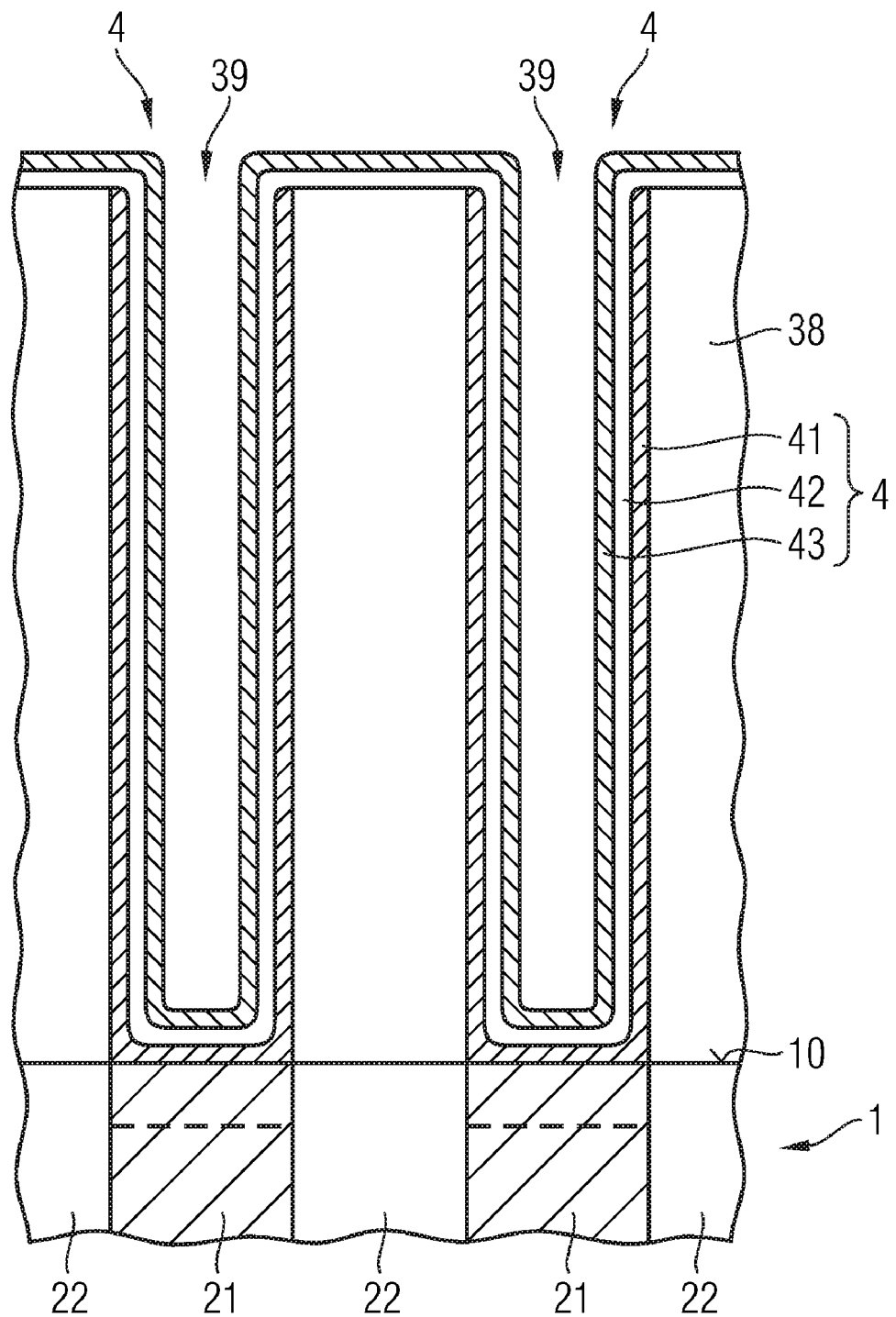

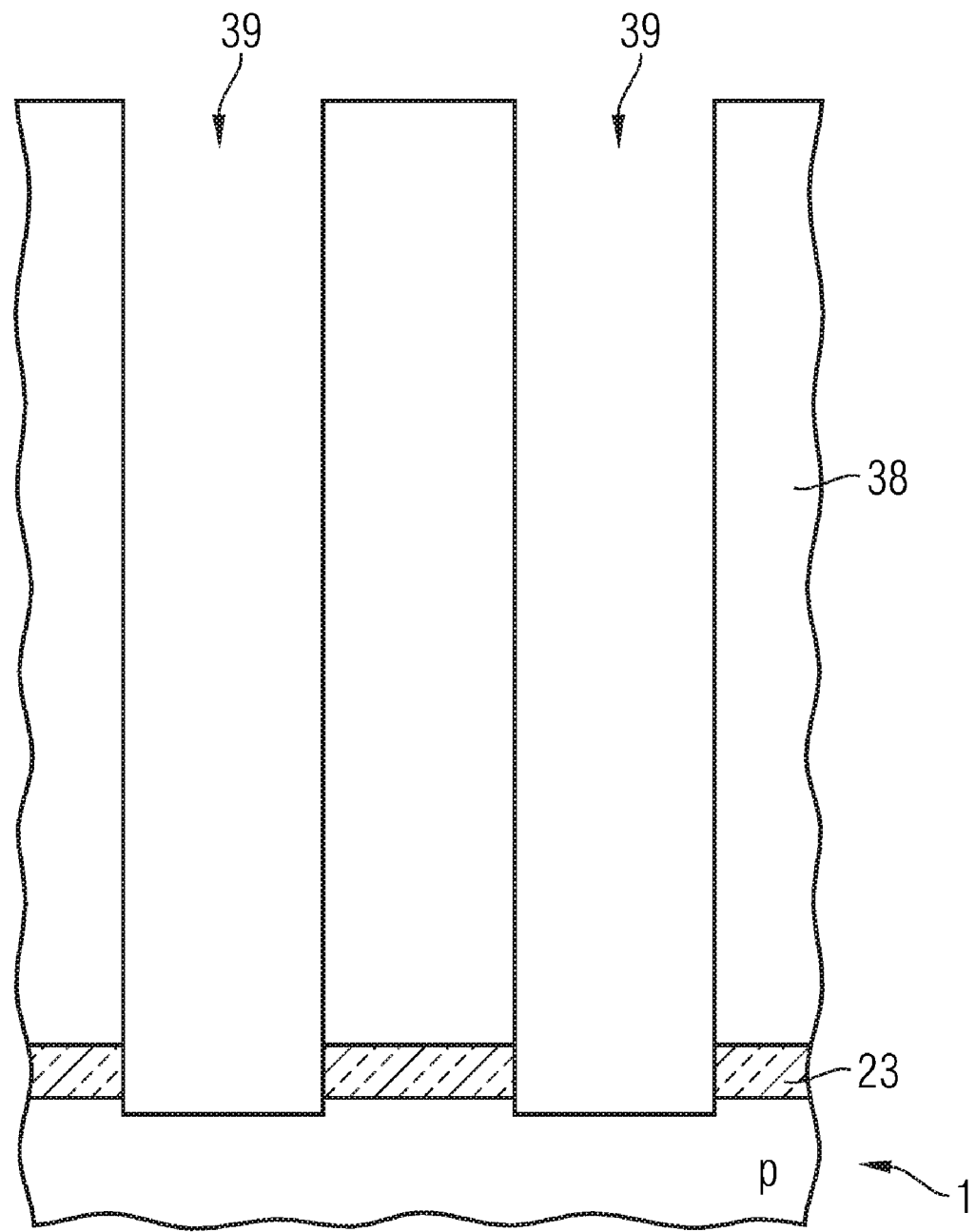

METHODS FOR FORMING AN INTEGRATED CIRCUIT, INCLUDING OPENINGS IN A MOLD LAYER FROM NANOWIRES OR NANOTUBES

CROSS-REFERENCE TO RELATED APPLICATIONS

This Utility Patent Application claims priority to German Patent Application No. DE 10 2006 013 245.9 filed on Mar. 22, 2006, which is incorporated herein by reference.

BACKGROUND

The invention relates to a method for forming an opening in a mold layer and to methods for producing storage capacitors for dynamic semiconductor memory cells.

Dynamic semiconductor memory cells for DRAMs (Dynamic Random Access Memories) include a storage capacitor for storing the data and a selection transistor for addressing the storage capacitor.

Data are stored by charging or discharging the storage capacitor by using the selection transistor. The selection transistors of the DRAM memory cells are formed in a monocrystalline silicon substrate. In DRAM memory cells with a stacked capacitor, the storage capacitors are formed in a mold layer that covers a substrate surface of the silicon substrate. In DRAM memory cells with a trench capacitor, the capacitors are formed along trenches that are introduced into the semiconductor substrate from the substrate surface.

In order to obtain high packing densities in a DRAM semiconductor circuit, the projection area of the storage capacitor onto a planar substrate surface is minimized.

The charge stored on the capacitor changes owing to various leakage current mechanisms even when the memory cell is not addressed. In order to prevent a complete discharge of the capacitor, the charge is periodically refreshed in refresh cycles. The number of refresh cycles can be reduced if the capacitance of the storage capacitor is as large as possible. The requirement of a largest possible electrode surface area in conjunction with the—likewise sought—minimum projection area on the horizontal substrate surface give rise to the requirement for a largest possible vertical extent of the capacitor electrodes.

Stacked capacitors are usually formed in a mold layer that is applied to the substrate surface. Openings are etched into the mold layer. A first electrode, a capacitor dielectric and a second electrode are applied successively in the openings or along the inner walls of the openings. For this purpose, openings having an aspect ratio of depth to width of greater than 40:1 are required for DRAMs which are fabricated with a minimum lithographic feature size of less than 50 nm.

Present-day etching methods only enable aspect ratios of up to 25:1 for mold layers composed of silicon oxides in conjunction with sufficient profile fidelity and dimensional accuracy of the cross section of the etching at the trench bottom.

In order to enlarge the electrode areas, the stacked capacitors are also constructed from partial capacitors with a smaller vertical extent that are arranged one above another in a plurality of successive partial processes. What is disadvantageous about such methods is their increased process complexity.

In order to produce trench capacitors, an etching mask (hard mask), generally silicon oxide or nitride, is applied on a substrate surface of the semiconductor substrate. The etching mask is patterned by a photolithographic process and an opening is produced in the etching mask in the process. The opening is transferred into the underlying semiconductor substrate with the highest possible dimensional accuracy and profile fidelity in a further etching process. Since the etching mask is consumed during the etching of the trench for the capacitor in the semiconductor substrate, the etching mask has to be provided with a thickness which is all the higher, the deeper the trench etching into the semiconductor substrate is to be performed.

Restrictions similar to those for the opening for a stacked capacitor in a mold layer arise for the opening in the etching mask. The depth of a trench for a trench capacitor is thus limited by the maximum aspect ratio which can be realized for the opening in the etching mask.

The use of alternative etching mask materials requires comprehensive preliminary investigations and increases the process complexity.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 1A-1I illustrate the formation of a mold layer having an opening on the basis of diagrammatic cross sections through the structure to be processed in successive process phases in accordance with a first embodiment of the method.

FIG. 2 illustrates a cross section through two stacked capacitors having a cup-shaped inner electrode coated on a single side, which are produced in accordance with a second embodiment of the method.

FIGS. 4A-4E illustrate the production of trench capacitors in accordance with a fourth embodiment of the method according to the invention on the basis of cross sections through the structure to be processed in different process phases.

DETAILED DESCRIPTION

Figure 1A:
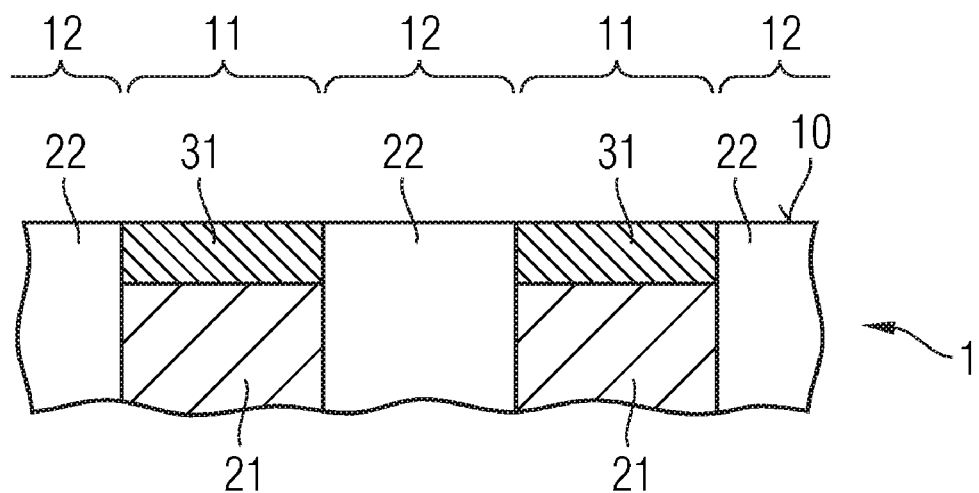

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments provide a method which enables the provision of forming integrated circuits, including openings in a mold layer, which openings can be realized with a high degree of profile fidelity even at high aspect ratios of more than 25:1. On the basis of this, the embodiments provide methods for producing an integrated circuit having capacitor and contact structures with a high aspect ratio.

In order to form a mold layer having an opening having a diameter of less than 500 nm, provision is made of a substrate having a substrate surface with a first area section and a second area section. A vertical template pillar composed of a self-assembling stencil material is grown in the first area section. A mold layer is then applied to the second area section. The template pillar is removed after the application of the mold layer. In this case, the opening is formed in the mold layer over the first area section of the substrate.

The template pillar functions as a template or lost mold for the patterning of the mold layer.

An anisotropic etching process into a homogeneous material is replaced by the process-technologically comparatively noncritical removal of the stencil material selectively with respect to the material of the mold layer. In principle any material that is essentially not removed during the removal of the template pillar can be used as stencil material. For instance materials which form $sp^2$ or $sp^3$ hybrids or semiconductor materials can be used for this.

The aspect ratio of such an opening is independent of process limitations such as are associated with the use of highly anisotropic etching processes. On account of the self-assembling structure of the template, the resulting openings have both a high degree of profile fidelity and dimensional accuracy even with an extremely high aspect ratio.

In accordance with one embodiment, the template pillar for its part grows in a precursor template whose pore has a larger diameter than the template pillar. For this purpose, prior to the growth of the template pillar, a conductive layer is applied to the substrate surface. A guide opening is introduced into the conductive layer, through which guide opening the first area section and adjoining sections of the second area section are uncovered. The cross section of the guide opening is greater than the cross section of the first area section, so that in the event of a possible deviation from the vertical, the slender template pillar grows in a manner guided by the sidewalls of the wide guide opening and its function as a template for forming an opening in the actual mold layer remains ensured. An inclination of the template pillar with leaning against adjacent template pillars in a dense array of template pillars is avoided. The situation where a template pillar that collapses during growth triggers the tilting of adjacent template pillars within a group of template pillars growing in the same way and in high density is likewise prevented. The larger diameter of the guide opening enables the forming thereof by a photolithographic imaging method. The requirements made of the resolution of the imaging method for forming the guide openings are relaxed in comparison with those of an imaginary imaging method for forming the template pillars.

In a further embodiment, the mold layer is formed after the growth of the template pillar on the basis of the conductive layer. According to a first embodiment, for this purpose the material of the conductive layer, after the growth of the template pillar, is heated in the course of a heat treatment process or is subjected to a thermal treatment and in the process is heated to above a temperature at which a flowing of the mold layer commences. After the heat treatment process, the conductive layer encloses the template pillar in flush fashion and thus forms the mold layer. Since the material of the mold layer is already situated on the substrate surface during the formation of the template pillar and, during the flowing of the material of the conductive layer, this places itself uniformly on all sides of the template pillar, a comparatively low mechanical stress of the template pillar arises during the formation of the mold layer.

In another embodiment, voids that remain in the guide opening between the conductive layer and the template pillar are filled with a filling material. The filling material adjoins the template pillar in flush fashion and together with the conductive layer forms the mold layer. Leaning of a template pillar against adjacent template pillars during the formation of the mold layer is avoided, thereby reducing consequential damage to be assigned in each case to a template pillar that has leaned.

According to a first embodiment, the template is a nanowire. For this purpose, provision is made of a catalyst cluster composed of a catalyst material on the first area section. The catalyst material is chosen such that it can form a liquid alloy with the stencil material, upon the cooling of which alloy the stencil material crystallizes out in pure form.

The catalyst cluster is heated and the catalyst material is melted in the process. The stencil material is supplied in pure form or in the form of a precursor material. The stencil material or precursor material is preferably absorbed at the catalyst cluster. This gives rise to a liquid alloy composed of the stencil material and the catalyst material. By continuously supplying the stencil material, the liquid alloy is supersaturated with the stencil material. The stencil material crystallizes out, and it preferably grows on the first area section as a nanowire.

The catalyst material is removed prior to or in the course of the removal of the template pillar.

The thickness and the cross section of the nanowire are essentially determined by the basic area of a droplet that has emerged from the catalyst cluster. The diameter of the catalyst droplet can be defined by the quantity of the deposited catalyst material (or the layer thickness thereof), by a photolithographic patterning process or by a catalyst template. Nanowires grow with high profile fidelity and are mechanically stable.

The cross section of the nanowire may correspond to that of the catalyst droplet or, independently thereof, be round, oval, elliptical, square or hexagonal.

In accordance with one embodiment of this method, in each case alternately one after another sections of the template pillar are grown and sections of the mold layer are applied as far as at most the respective upper edge of the template pillar. The catalyst material is preserved during the application and after the application of the respective section of the mold layer.

It is thus possible to increase the length of the nanowire and thus to enlarge the aspect ratio of the opening, the already grown portion of the nanowire being mechanically stabilized by the sections of the mold layer that have been deposited in the meantime.

Accordingly, for the case of a two-stage growth of the template pillar, firstly the first section of the template pillar is grown. A first section of the mold layer is applied, the upper edge of the template pillar not being covered or being uncovered again after being covered. The first section of the mold layer stabilizes the first section of the template pillar. A second section of the template pillar is then grown. A second section of the mold layer is grown on the first section of the mold layer. Further stages may follow in a corresponding manner. The height of the nanowire above the substrate surface can be increased further in this way.

By virtue of the catalyst material being preserved, the process complexity is only comparatively slightly increased relative to a single-stage method.

According to a further embodiment, the sections of the template pillar and the sections of the mold layer are grown and applied in each case alternately one after another, in which case, in contrast to the method mentioned above, the catalyst material is formed anew in each case prior to the growth of a further section of the template pillar.

In a particularly manner, monocrystalline silicon is provided as stencil material. Silicon is compatible with the present-day production processes for producing a DRAM. Precursor stages (precursor materials) for silicon and also means for supplying such precursor materials are available in existing fabrication environments. The silicon is preferably supplied in the form of $SiH_4$ or $SiCl_4$. The precursors and auxiliary means for supplying the precursors are available to a great extent, with the result that the implementation of this method into a process milieu for producing DRAMs requires hardly any additional outlay in this regard. A silicon wire, on a planar silicon area, takes up the crystal orientation thereof and grows directionally and vertically with respect to the silicon area.

Gold, iron or aluminum is preferably provided as catalyst material. Mixtures of gold, iron and aluminum together with silicon form eutectic melts having a comparatively low melting point, which is therefore suitable for a production process for DRAMs. Upon cooling of a melt supersaturated with silicon and including the materials mentioned, the silicon crystallizes out in pure form.

Aluminum forms a eutectic melt with silicon at temperatures of as low as approximately 580° C. This temperature essentially corresponds to the deposition temperature of an amorphous silicon etching mask, with the result that the temperature budget of the wafer is not significantly increased by the forming of silicon wire templates.

According to a further embodiment of the method, a nanotube is grown as template pillar. For this purpose, firstly a catalyst cluster composed of a catalyst material is provided on the first area section. The catalyst material is chosen such that it supports the formation of a nanotube composed of the stencil material. The catalyst cluster is heated to a forming temperature at which the stencil material is formed in self-assembling fashion as a nanotube enclosing the catalyst cluster. The stencil material or a precursor stage of the stencil material is supplied. The stencil material grows in ring-shaped fashion around the catalyst cluster on the substrate.

The stencil material is carbon, for example. Nickel, for instance, is used as catalyst material.

Irrespective of whether the template pillar is grown as a nanowire or as a nanotube, for the application of the catalyst material firstly an auxiliary layer is applied to the substrate. The auxiliary layer is preferably patterned by photolithographic methods, an auxiliary opening being formed in the auxiliary layer over the first area section. The cross section of the auxiliary opening is decreased further, if appropriate, by using spacer structures (sidewall spacers) on the inner walls of the auxiliary opening. The auxiliary opening is subsequently filled with the catalyst material.

The filling of the auxiliary opening is preferably effected by deposition of the catalyst material onto the auxiliary layer and into the auxiliary openings. The catalyst material bearing on the auxiliary layer outside the auxiliary openings is removed by chemical mechanical polishing, for instance.

The auxiliary layer can be removed or remain as a catalyst template during the growth of the template pillar on the substrate. The contour or the position of the catalyst droplet can be defined precisely in this way.

If a multiplicity of openings are provided in the mold layer, then they have cross sections that deviate only slightly from one another.

According to a further embodiment, the catalyst material is applied by a procedure in which firstly a layer composed of the catalyst material is applied and the applied layer is patterned by a photolithographic method. In this case, the catalyst material is preserved over the first area section and adjoining sections of the second area section, whereas it is removed from further sections of the second area section. If appropriate, the catalyst material can be pulled back further in a subsequent isotropic etching process, with the result that sub-lithographic cross section of the template pillars are also made possible. Chemical mechanical polishing is obviated.

According to a further embodiment of the method, the template pillar is grown without additional catalyst. This variant, referred to as vapor-solid process, is similar to the vapor-liquid-solid process already described above, with the difference that one of a plurality of gaseous starting substances of the stencil material acts as catalyst.

The growth of the template pillar then includes the formation of a structural defect in the first area section of the substrate. The substrate is heated to a forming temperature at which the stencil material grows selectively almost exclusively in the region of the structural defect and then on the already grown stencil material as a nanowire.

The gaseous starting substances of the stencil material are supplied. The stencil material sublimates selectively firstly in the region of the structural defect and thereafter along the upper edge of the growing nanowire.

Zinc and oxygen are preferably supplied as gaseous starting substances. Besides the growth of zinc oxide nanowires, the growth of GaN nanowires as template pillars is also possible in this way.

The mold layer is applied by a spin-on method. The mechanical stress of the template pillars is reduced in this case.

The removal of the template pillar from the opening in the mold layer is preferably effected by a wet etching process with high selectivity with respect to the material of the mold layer. The material of the mold layer is chosen such that it can be applied in a manner which does not permit the template pillars to collapse, and that, on the other hand, the stencil material can be etched with high selectivity with respect to the material of the mold layer.

A first mold layer is applied, for instance a polymer. Afterward, the pillar material is removed and replaced by a further pillar material that forms stabler template pillars. The first mold material is then removed in a wet etching process and the desired end material of the mold layer is applied as second mold layer.

In this way, the requirements made of the respective mold material with regard to the embedding of the first template pillars and with regard to the final function can be decoupled from one another.

In accordance with a further embodiment, a plurality of openings having a diameter of in each case less than 500 nanometers are formed in the mold layer by using a template of template pillars of identical type, the openings being at a distance of less than 150 nanometers from one another. In this case, the simultaneous patterning of all the guide openings of the conductive layer may be difficult.

One method for this therefore provides firstly only the patterning of a first subset of guide openings within a first conductive layer, with the result that the minimum distance between two guide openings can be increased compared with the case of simultaneously patterning all the guide openings. First template pillars are then formed in the guide openings of the first subset in accordance with one of the method procedures already described. A further conductive layer is formed from the first conductive layer. The patterning for in each case a further subset of guide openings and also the growth of in each case further template pillars are then repeated once or more than once. In this case, to remove the catalyst material on the already grown template pillars after the formation of the respective next conductive layer, in order to prevent the template pillars from growing further at a later point in time. The respective last conductive layer forms the mold layer.

The forming of the first and of the further guide openings is effected in each case by a photolithographic patterning method. For the photolithographic patterning methods there results in each case an increase in the distance between the structures (pitch), and also the possibility of realizing guide openings having a larger diameter without adjacent guide openings touching one another.

The permissible tolerance for the alignment of the masks of the respective patterning methods relative to one another is comparatively high. Deviations in the diameter of the guide openings are likewise noncritical, so that the requirements made of the two patterning methods are comparatively relaxed overall. In this context, either nanowires, for instance composed of Si or ZnO, or nanotubes, for instance composed of C, may be grown as template pillars according to one of the methods described above.

One or more embodiments provide a mold layer having an opening can be incorporated into novel methods for producing contact structures and capacitors.

In order to produce a contact structure, provision is made of a substrate having a planar substrate surface and a conductive structure adjoining the substrate surface in a first area section. A mold layer having an opening is provided on the substrate in accordance with the above-described methods according to the invention. The opening is filled with a conductive material. The conductive material within the opening forms the contact structure. The contact structure adjoins the conductive structure.

The method enables the production of contact structures having an extremely high aspect ratio and a uniform cross section over the entire height. The complicated etching of an opening into the mold layer is obviated.

In order to produce a stacked capacitor having a solid inner electrode (pad-shaped stacked capacitor), a substrate is provided. A mold layer having an opening is provided on the substrate in accordance with the above-described method according to the invention. The opening is filled with a conductive material, which forms a first electrode of the capacitor. The mold layer is removed. A dielectric layer is applied on the first electrode. The dielectric layer forms the capacitor dielectric. A layer composed of a conductive material is applied to the dielectric layer. The second conductive material forms a second electrode of the capacitor.

Accordingly, one method enables the production of capacitors with extremely high electrodes over the substrate. By virtue of the formation with profile fidelity over the entire height, the deviations in an array of capacitors formed in the same way on the same substrate are very small. On account of the high profile fidelity of the cross section of the opening over the entire height, process formations at the sidewalls of the openings are infrequent and the quality of a deposited capacitor dielectric is high.

In order to produce a stacked capacitor having a cup-shaped inner electrode coated on a single side (single-sided cup-shaped stacked capacitor), a substrate is provided and a mold layer having an opening is provided on the substrate in accordance with the above-described method according to the invention. A first electrode layer is applied to the inner wall of the opening, the first electrode layer forming the inner electrode. A dielectric layer is applied as capacitor dielectric to the first electrode layer. A second electrode layer is applied on the dielectric layer.

In order to produce a stacked capacitor having a cup-shaped inner electrode coated on two sides, the mold layer is removed prior to the application of the dielectric layer, with the result that the capacitor dielectric coats the inner electrode on both sides.

The requirement of shaping an opening having a high aspect ratio by an etching process (high aspect ratio etch) is obviated. The formation of the opening with profile fidelity results in a high quality of the deposited electrode and dielectric layers. By virtue of the high dimensional accuracy of the openings, only slight deviations in the capacitance value arise between a plurality of stacked capacitors produced in the same way on the same substrate.

In order to produce a trench capacitor in a substrate, firstly a silicon substrate is provided. According to the method according to the invention for providing a mold layer having an opening, a mask layer having an opening is applied to the substrate. The opening is imaged into the silicon substrate, a trench having an inner wall being formed in the silicon substrate. An outer electrode of the trench capacitor is formed in a section of the substrate which encloses the trench and adjoins the trench. A capacitor dielectric is applied on the inner wall of the trench. A layer composed of a conductive material, which forms an inner electrode of the trench capacitor, is applied on the capacitor dielectric.

The mask layer is pulled back during the imaging of the opening into the silicon substrate. Owing to the fact that the mask layer can be provided with a significantly increased layer thickness by the method according to the invention compared with conventional methods and the layer thickness of the mask layer determines the maximum depth of the etching process into the substrate, the method according to the invention enables the formation of trench capacitors having a significantly increased aspect ratio compared with conventional methods.

FIGS. 1A to 1I illustrate the production of a mold layer having openings.

In a substrate 1 having a substrate surface 10, conductive structures are formed which adjoin the substrate surface 10. The conductive structures are contacts 21, for example, which adjoin for instance source/drain regions of transistors that are formed outside the illustrated region in a semiconductor section of the substrate 1. The contacts 21 adjoin the substrate surface 10 in the region of first area sections 11 of the substrate 1. The contacts 21 are embedded in an interlayer dielectric (ILD) 22, which adjoins the substrate surface 10 in second area sections 12 of the substrate 1. The contacts 21 include a metal, a conductive metal compound or doped polycrystalline silicon (polysilicon). The interlayer dielectric 22 includes an insulator material, for instance a doped silicon oxide or a silicon nitride.

The contacts 21 are pulled back, for instance by a wet etching process, proceeding from the substrate surface 10 selectively with respect to the interlayer dielectric 22. A catalyst material is deposited. The catalyst material fills the depressions produced by the etching back of the contacts 21 above the contacts 21 and covers the substrate surface 10. The sections of the catalyst material deposited outside the depressions above the contacts 21 on the substrate surface 10 are removed by chemical mechanical polishing, for instance.

This results in the structure illustrated in FIG. 1A. In the region of the first area sections 11, catalyst clusters 31 formed from the catalyst material cover the contacts 21. The catalyst clusters 31 are enclosed by the interlayer dielectric 22.

The catalyst material is chosen such that it forms together with silicon an alloy melt (liquid alloy) in the case of which, upon supersaturation with silicon, above the eutectic temperature, the silicon crystallizes in pure form. The catalyst material is accordingly selected on the basis of the phase diagrams of the respective materials with silicon. Gold Au forms together with silicon Si at temperatures above the eutectic temperature and upon supersaturation with silicon a melt including solid silicon portions and liquid AuSi. Iron Fe forms at temperatures above approximately 1200 degrees Celsius and upon supersaturation with silicon a melt including crystallized silicon and liquid FeSi.

In the text below, aluminum Al is considered as catalyst material and it is assumed that the contact 21 is formed from monocrystalline silicon at least in a section adjoining the catalyst cluster 31.

A catalyst cluster 31 is heated to a temperature above the eutectic temperature of the binary aluminum-silicon system. The catalyst cluster 31 melts. The silicon of the contact 21 is melted along an interface 35 between the catalyst cluster 31 and the contact 21. The molten silicon and the catalyst material form an alloy melt 32 (liquid alloy, alloy droplet).

Figure 1B:
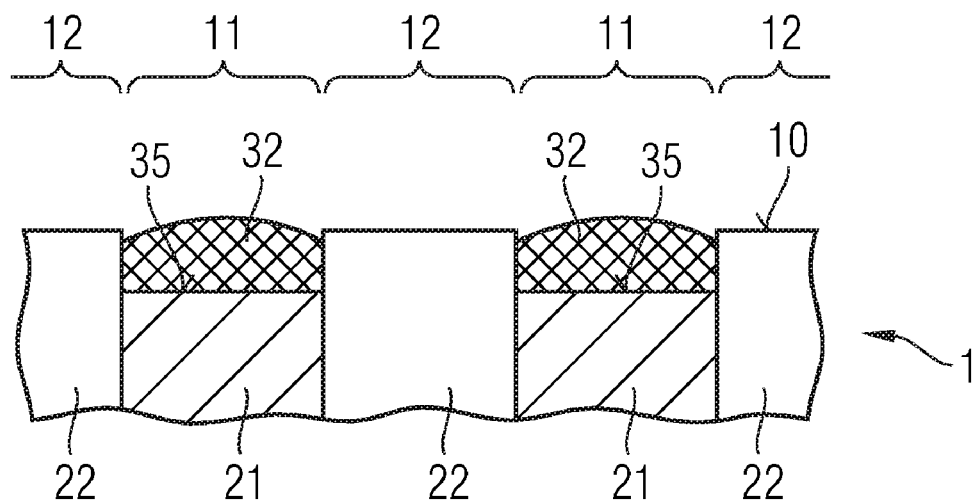

In accordance with FIG. 1B, droplets of the alloy melt 32 cover the contacts 21, which are enclosed by the interlayer dielectric 22 in the horizontal direction.

Silicon is supplied. The supply of silicon is effected for example by laser ablation of a silicon target. The supply of silicon is preferably effected by supply 33 of a silicon-containing precursor material. The precursor material is $SiH_4$ or $SiCl_4$, for instance. The precursor material 34 is absorbed in the alloy melt 32. The alloy melt 32 is supersaturated with silicon in this case. The excess silicon crystallizes out in pure form and deposits preferably at the interface 35. With continuing supply of the precursor material 33, a silicon nanowire having approximately the cross section of the contact 21 starts to grow vertically with respect to the substrate surface 10, a droplet of the alloy melt 32 remaining on each growing silicon nanowire.

Figure 1C:
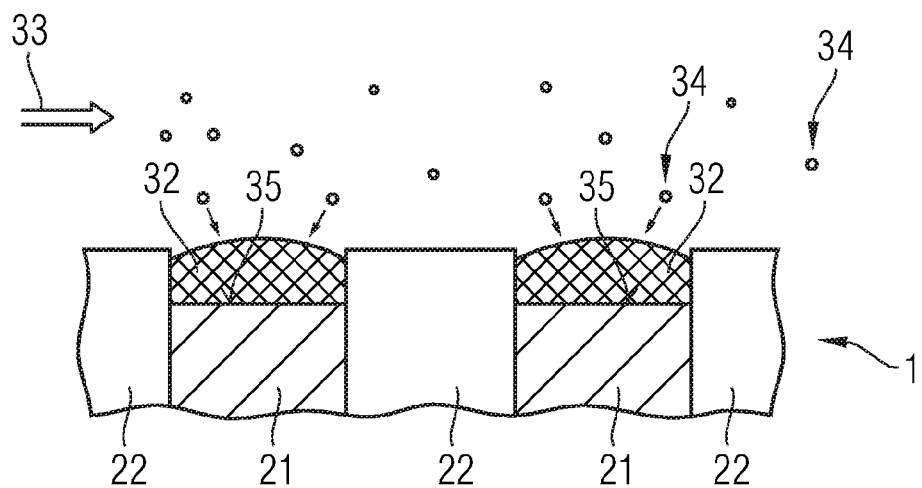

FIG. 1C schematically illustrates the supply 33 of the precursor material 34 and also the absorption of the precursor material 34 into the alloy melt 32.

When the template pillar 36 is grown according to a vapor-solid process, the catalyst cluster 31 is replaced by a structural defect in the region of the first area section 11, or the catalyst cluster 31 acts as such a defect. The structural defect is, for instance, a targeted imperfection of the crystal lattice at the surface of the contact 21 or of the substrate 1 in accordance with FIG. 7A.

Figure 1D:
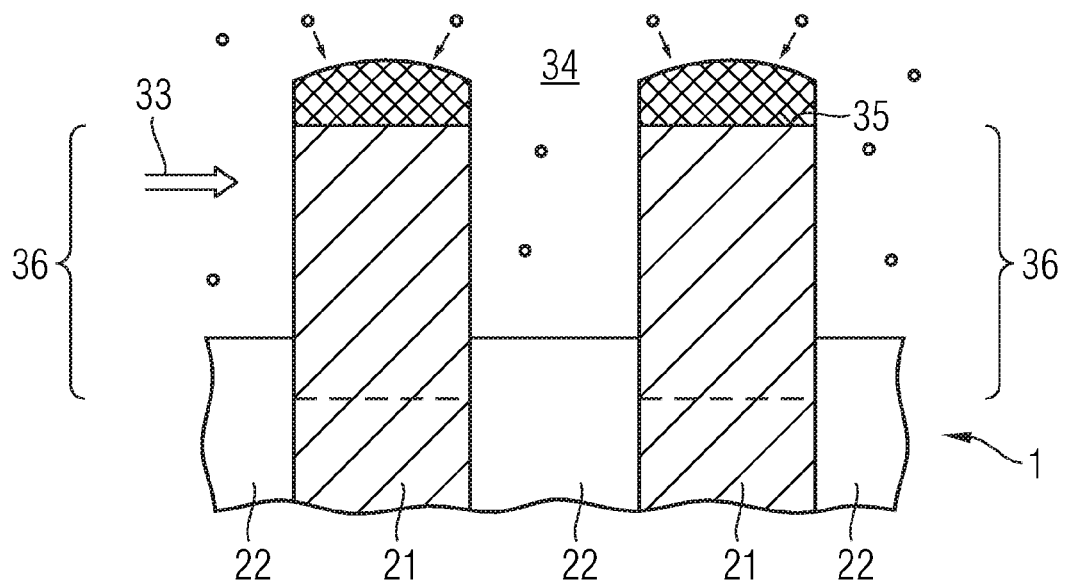

In accordance with FIG. 1D, the excess silicon of the alloy melt 32 grows along the interface 35 with the contact 21 and forms a silicon nanowire as template pillar 36 for each contact 21. The cross section of the template pillar 36 is determined by the cross section of the contact structure 21 (and also by the dimensioning of the alloy melt 32). The cross section may be circular, oval, elliptical, rectangular or hexagonal. The diameter of the template pillar 36 is between 5 and 50 nm. The aspect ratio between the height and the diameter of the template pillar 36 is between 2:1 and 100000:1 and includes extremely high aspect ratios.

The process is terminated as soon as the template pillar 36 has reached the desired length or height above the substrate 1. For this purpose, the supply of silicon is ended and/or the temperature is lowered below the eutectic temperature.

FIG. 1E illustrates the grown silicon nanowires as template pillars 36 after the temperature has been lowered below the eutectic temperature. The template pillars 36 grow with profile fidelity and dimensionally accurately in the vertical direction with respect to the substrate surface 10. Each silicon nanowire is a silicon single crystal. The upper edges of the silicon nanowires are in each case covered by a catalyst cap 37.

Figure 1F:
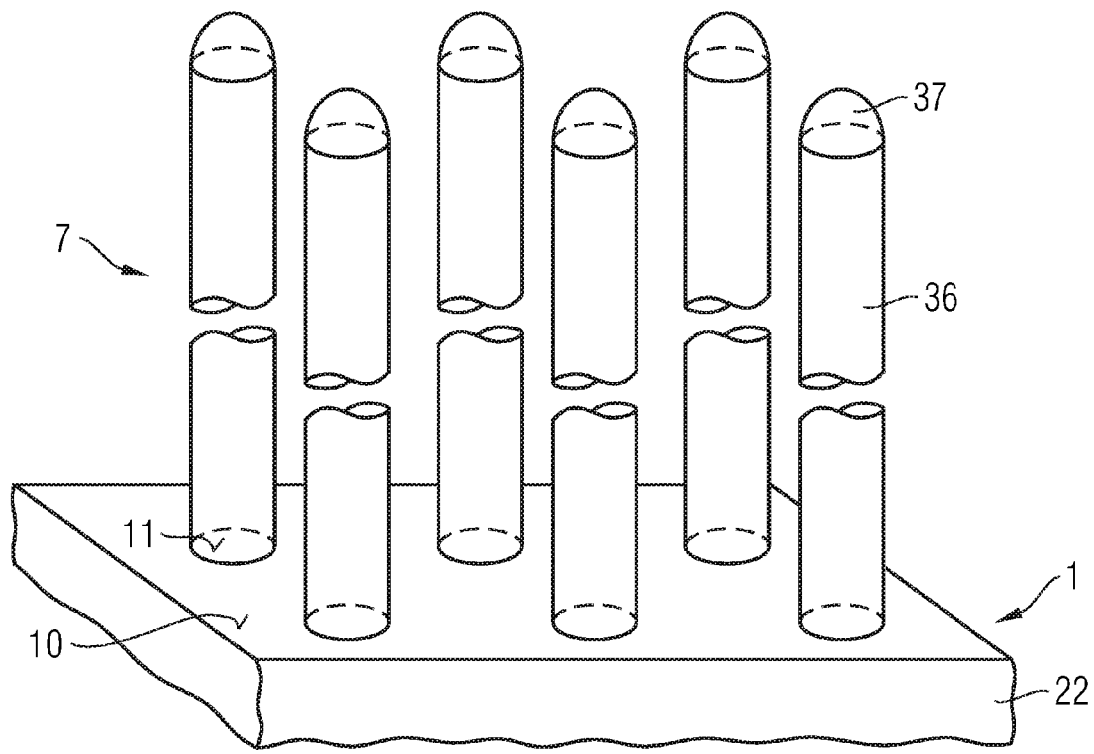

FIG. 1F illustrates an array having a plurality of template pillars 36 arranged regularly on a substrate 1. The template pillars 36 are aligned with respect to contact structures 21 adjoining the substrate surface 10 in the substrate 1. Each template pillar 36 is terminated by a catalyst cap 37.

The pillar array of FIG. 1F is filled by a mold layer 38 being applied over the second area sections 12 of the substrate 1. The material of the mold layer 38 is preferably a doped silicon oxide. The mold layer 38 is preferably applied in solid form, in which case the material can be densified in a subsequent reflow process.

Figure 1G:
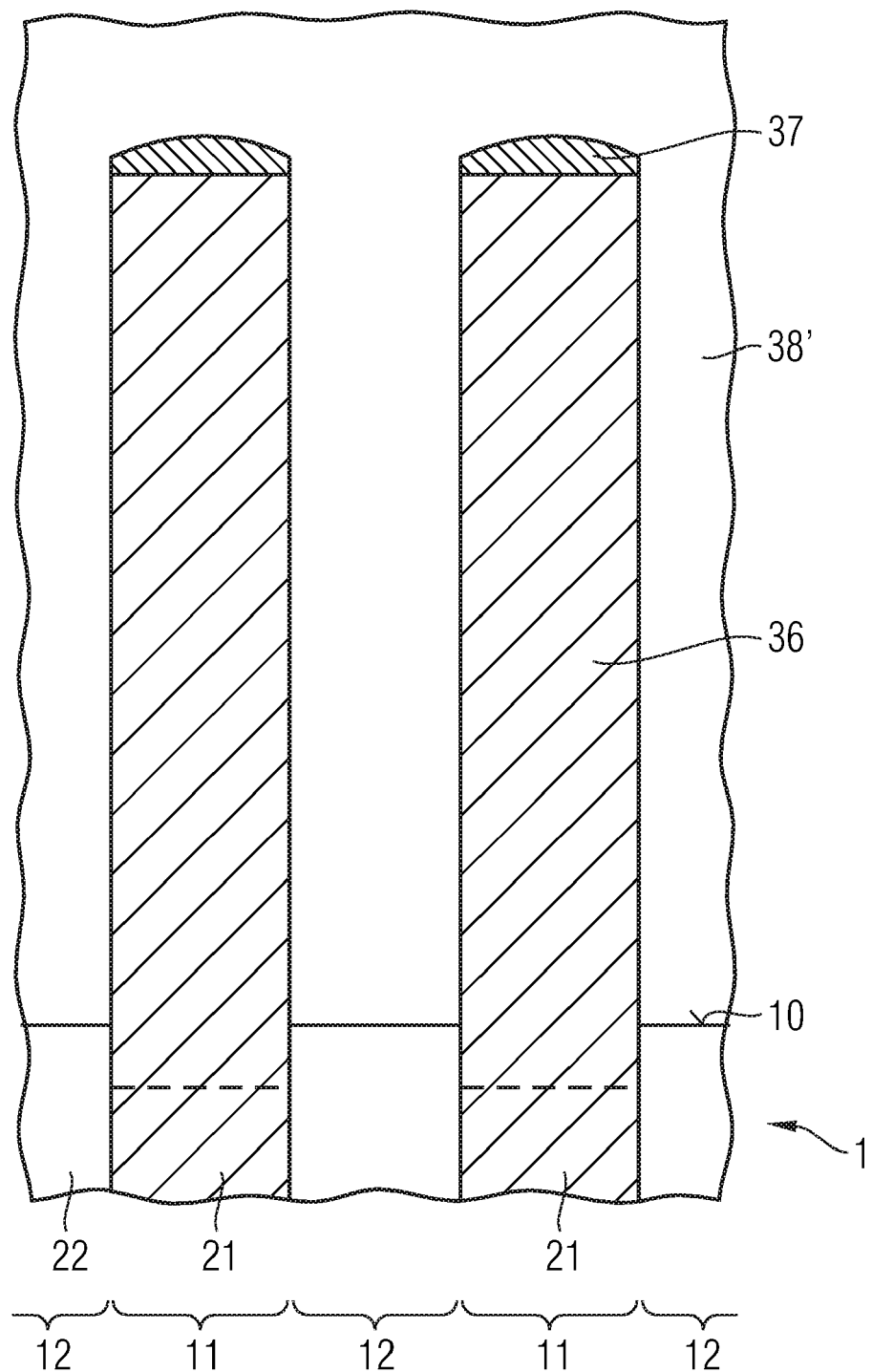

FIG. 1G illustrates two template pillars 36 covered by the material 38' of the mold layer. The catalyst caps 37 are removed for instance in the course of a chemical mechanical polishing process and for planarization of the material 38' of the mold layer and matching of the heights of the silicon nanowires 36.

FIG. 1H illustrates the template pillars 36 now embedded into the planarized mold layer 38. The template pillars 36 are removed by a dry or wet etching process selectively with respect to the mold layer 38. This gives rise to openings 39 at the location of the template pillars 36 in the mold layer 38.

Figure 1I:
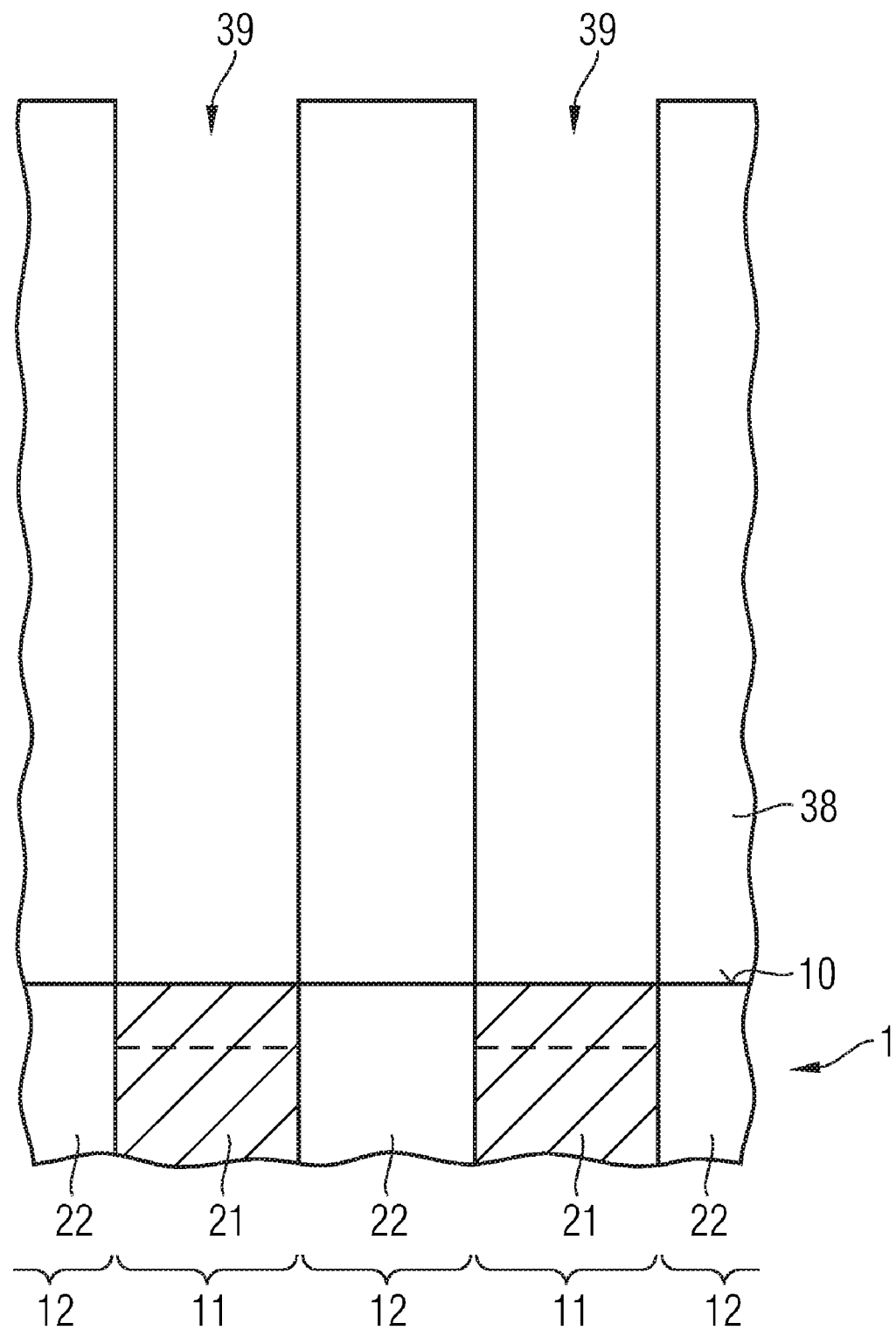

In accordance with FIG. 1I, the openings 39 uncover the contacts 21 in the substrate 1. The openings 39 have an aspect ratio of preferably between 50:1 and 1000:1 given basic areas of less than 250 $nm^2$. Due to the self-assembling, directional and regular growth of the silicon nanowires, the cross sections of the openings 39 exhibit profile fidelity and dimensional accuracy.

FIG. 2 follows on from FIG. 1H. A first conformal layer composed of a first conductive material is applied to the mold layer 38 and into the openings 39, and also to the uncovered sections of the contacts 21. The sections of the first electrically conductive material which bear on the mold layer 38 outside the opening 39 are removed. The pulled-back sections of the first conformal electrically conductive layer in each case form a storage electrode 41—which is connected to the respective contact 21—of a stacked capacitor 4 having a cup-shaped storage electrode coated on a single side. A dielectric layer is deposited conformally. The dielectric layer covers in sections the storage electrode 41 and horizontal sections of the mold layer 38. The dielectric layer forms a capacitor dielectric 42 of the respective storage capacitor 4 in sections.

A second conformal layer composed of electrically conductive material is deposited on the dielectric layer. The second conformal electrically conductive layer forms the respective counterelectrode 43 of the storage capacitors 4 in sections.

FIG. 2 illustrates two storage capacitors 4 produced in this way. Storage electrode 41, capacitor dielectric 42 and counterelectrode 43 are in each case provided within the openings 39 in the mold layer 38 in accordance with FIG. 1I. The storage electrode 41 adjoins the respective underlying contact 21 in electrically conductively connected fashion. The storage electrode 41 includes, for instance, doped polysilicon, a metal or a conductive metal compound. The thickness of the storage electrode is between 2 and 35 nm.

The capacitor dielectric includes a hafnium or aluminum or other dielectric metal oxide or mixed oxide. The thickness of the capacitor dielectric is approximately 1 to 15 nm. The counterelectrode 43 is formed in a manner corresponding to the storage electrode 41.

The two storage capacitors each have a basic area of less than 250 nm$^2$. The height of the capacitors 4 above the substrate surface 10 is up to a number of micrometers. By virtue of the uniform formation of the cross section of the openings 39 over the entire height, the thin layers of storage electrode 41, capacitor dielectric 42 and counterelectrode 43 have a high quality in each case.

Figure 3A:
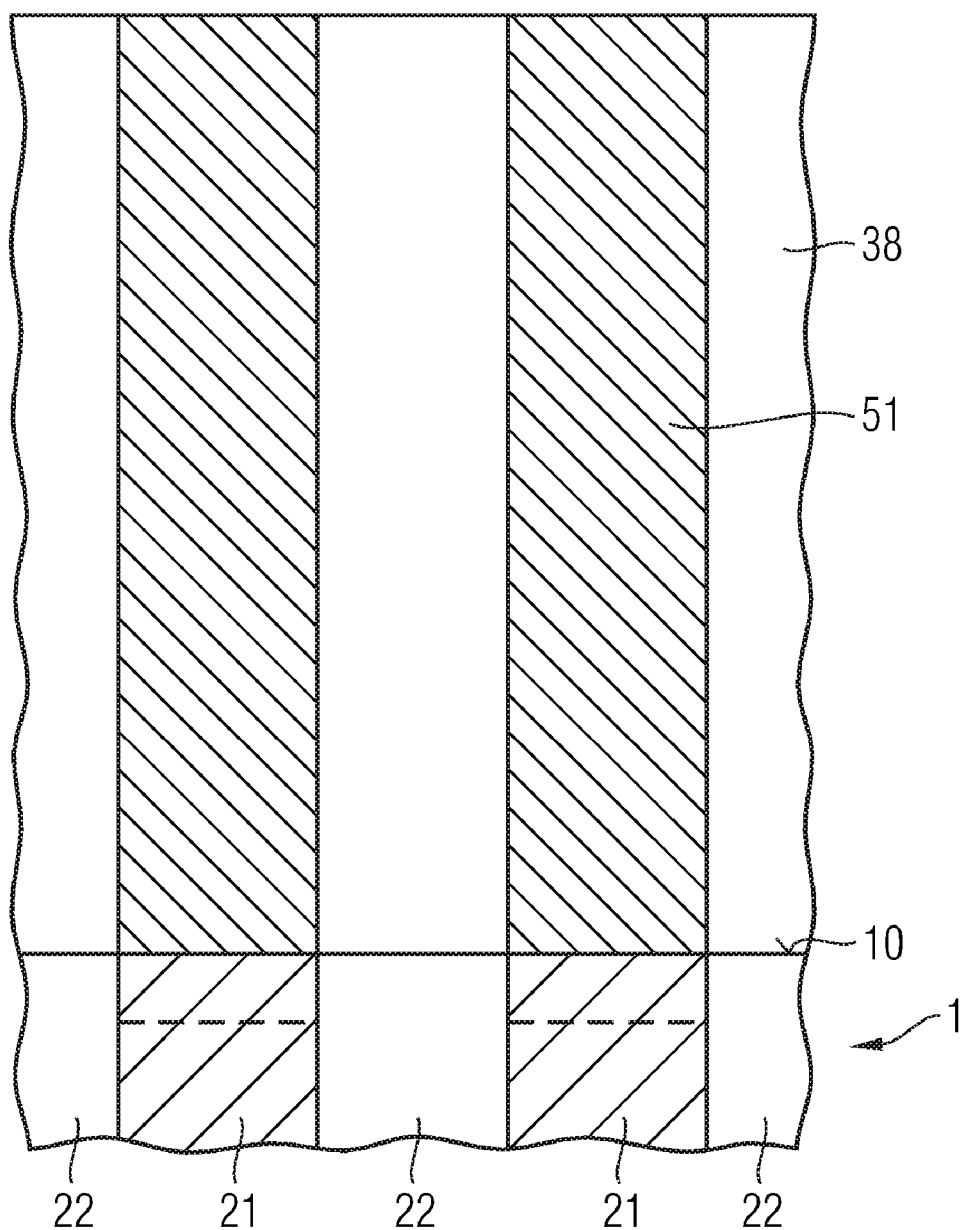
FIGS. 3A-3B illustrate the production of stacked capacitors having a solid inner electrode in accordance with a third embodiment of the method according to the invention on the basis of schematic cross sections through the structure to be processed in successive process phases.

FIG. 3A follows on from FIG. 1I and relates to the production of a contact structure or an inner electrode of a stacked capacitor having a solid inner electrode.

Proceeding from FIG. 1H, the openings 39 are filled with a conductive material. The conductive material in each case forms a structure 51 in the respective opening 39. The structures 51 are contact structures, for example, which connect the contacts 21 in the substrate 1 to further conductive structures to be provided above the mold layer 38, for instance connecting lines.

The structures 51 may also be interpreted as storage electrodes of storage capacitors having a solid storage electrode (pad-shaped stacked capacitor). The mold layer 38 is then removed after the introduction of the storage electrodes 51 into the openings 39. A dielectric layer is deposited, which in sections in each case forms a capacitor dielectric 52 of the respective capacitor 5 in the sections adjoining the storage electrodes 51. A conformal layer composed of electrically conductive material is deposited onto the dielectric layer, which material forms the counter electrodes 53 of the storage capacitors 5 in sections.

Figure 3B:
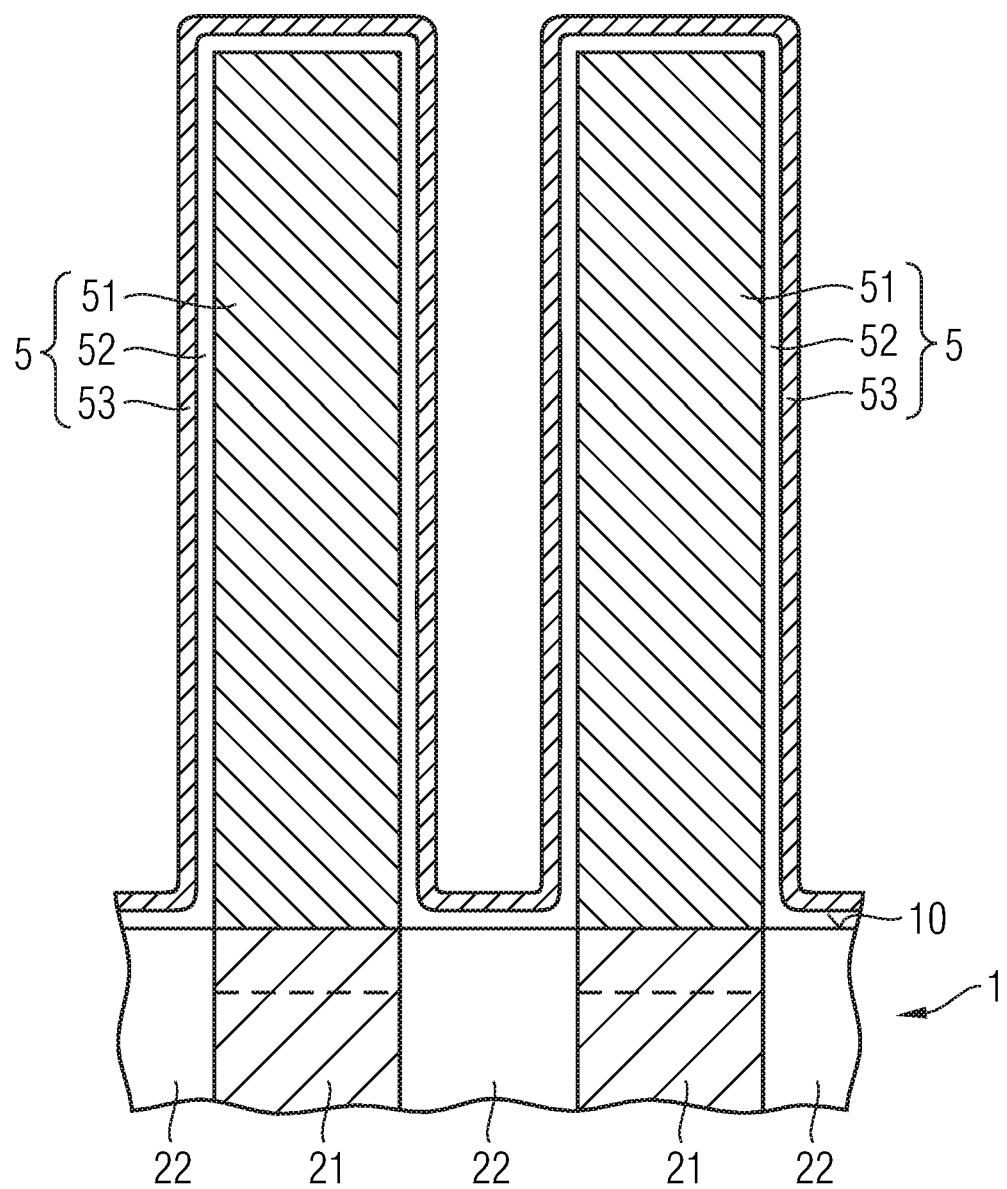

FIG. 3B follows on from FIG. 3A in this respect and illustrates two stacked capacitors 5 having a solid storage electrode 51. The storage electrodes 51 are in each case aligned with respect to a contact 21 in the substrate 1.

FIG. 4A to FIG. 4E relate to the production of trench capacitors. A monocrystalline silicon substrate 1 is provided. The silicon substrate 1 has a p-type doping in a section adjoining a substrate surface 10. The semiconductor substrate 1 is n$^+$-doped in a lower section of the semiconductor substrate 1, the lower section not being illustrated in FIG. 4A. An auxiliary layer is applied on the substrate surface 10. The auxiliary layer includes silicon nitride, for instance. Openings are introduced into the silicon nitride layer photolithographically over first area sections 11 of the semiconductor substrate 1, which openings uncover the semiconductor substrate 1 in sections. The openings are filled with a catalyst material. The catalyst material forms catalyst clusters 31 in the openings. The catalyst material is chosen in the manner described above. The catalyst material is assumed to be gold in the text below.

Figure 4A:
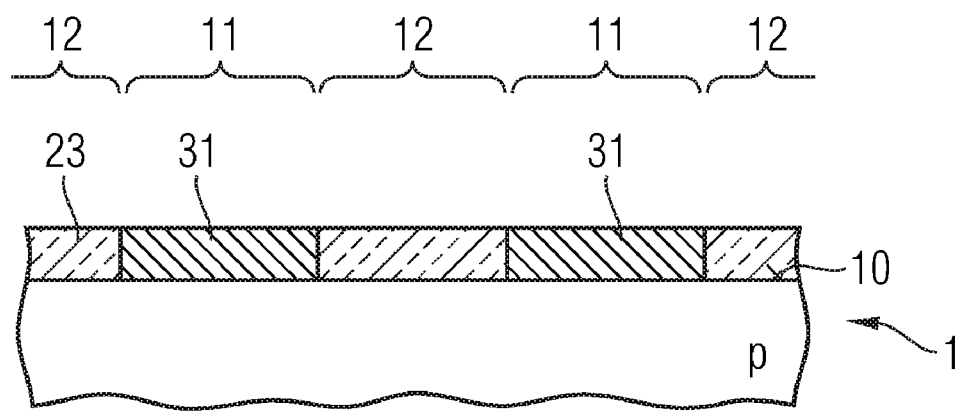

FIG. 4A illustrates the catalyst clusters 31 provided over the first area sections 11 of the silicon substrate 1. The catalyst clusters 31 are surrounded by a catalyst template 23 formed by residual sections of the auxiliary layer.

The catalyst clusters 31 are heated above the eutectic temperature. The catalyst cluster 31 starts to melt proceeding from the interface 35 between the catalyst cluster 31 and the silicon substrate 1.

Figure 4B:
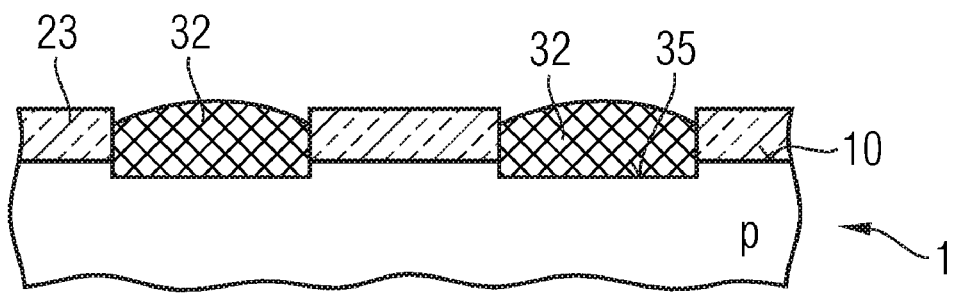

FIG. 4B illustrates the alloy melts 32 that have emerged from the catalyst clusters 31. Hereinafter, analogously to FIGS. 1C, 1D, 1E, 1G, 1H and 1I, template pillars 36 are grown, a mold layer 38 is provided, which fills the interspaces between the template pillars 36, and, finally, the template pillars 36 are removed. Analogously to FIG. 1I, the structure in accordance with FIG. 4C is produced for the present case. The openings 39 in the mold layer 38 reach at least as far as the upper edge of the silicon substrate 1 or, as illustrated in FIG. 4B, into the substrate. The catalyst template 23 underlies the mold layer 38.

The mold layer 38 hereinafter functions as an etching mask (hard mask). An anisotropic etching process is performed, by which the openings 39 are imaged into the underlying semiconductor substrate 1 with profile fidelity and dimensional accuracy. The etching mask 38 is consumed in the process. Since the etching mask 38 can be provided with virtually any desired thickness, the depth of the etching into the silicon substrate 1 is no longer limited by the maximum thickness for the formations of openings 39 in the hard mask by etching.

Figure 4D:
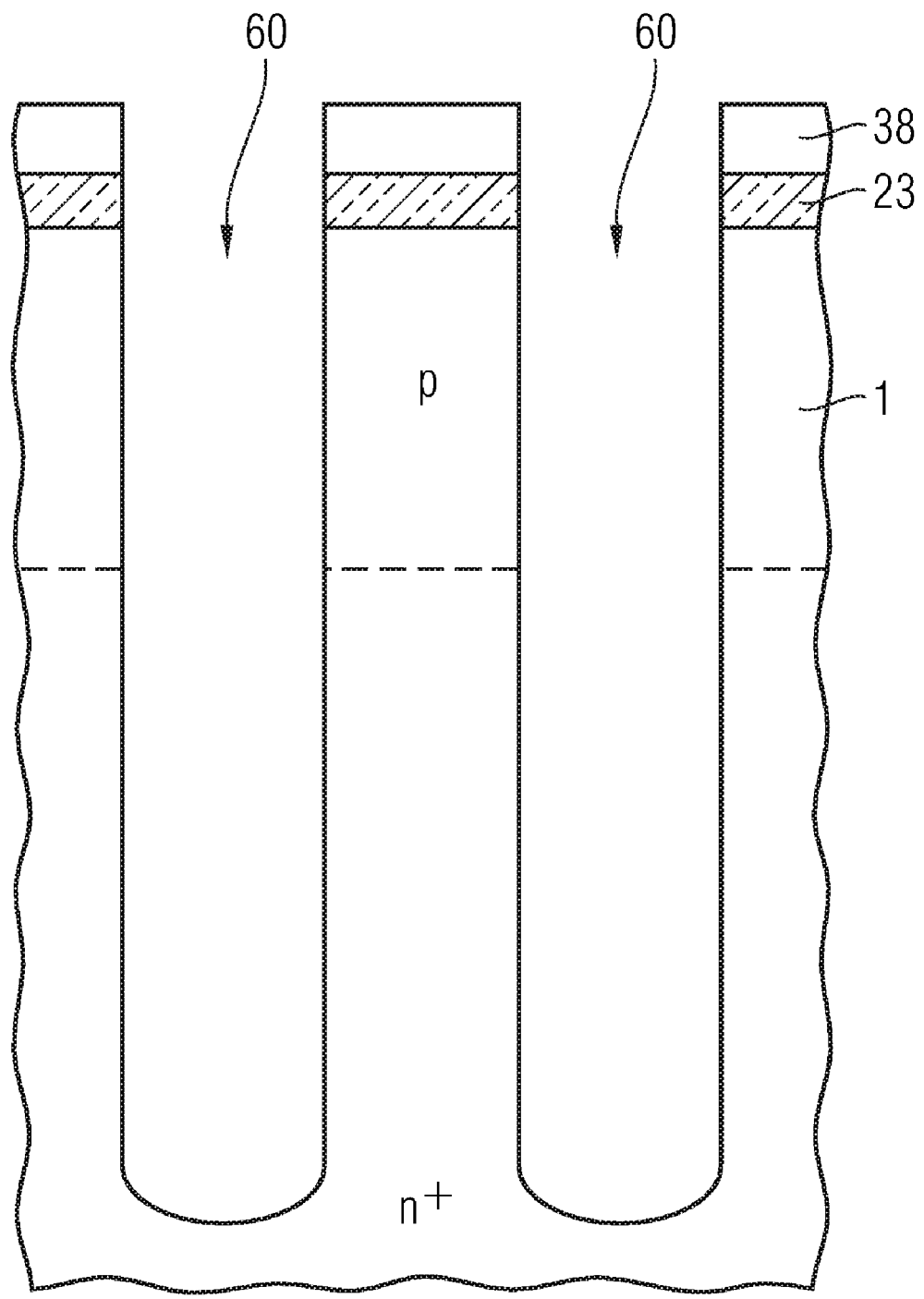

FIG. 4D illustrates the capacitor trenches 60 produced in the semiconductor substrate 1 by the imaging of the openings 39 into the semiconductor substrate 1. The capacitor template 23 and a residue of the etching mask 38 bear on the substrate surface 10 of the semiconductor silicon substrate 1. The capacitor trenches 60 reach into the lower, n$^+$-doped sections of the semiconductor substrate.

A dielectric layer is provided on the inner walls of the capacitor trenches 60, which forms a capacitor dielectric 62 of the trench capacitor 6 in sections. The capacitor trenches 60 are filled with a conductive material, which forms an inner electrode 61 of the trench capacitor 6 in sections. A counterelectrode 63 is formed by the n$^+$-doped section of the silicon substrate 1.

Figure 4E:
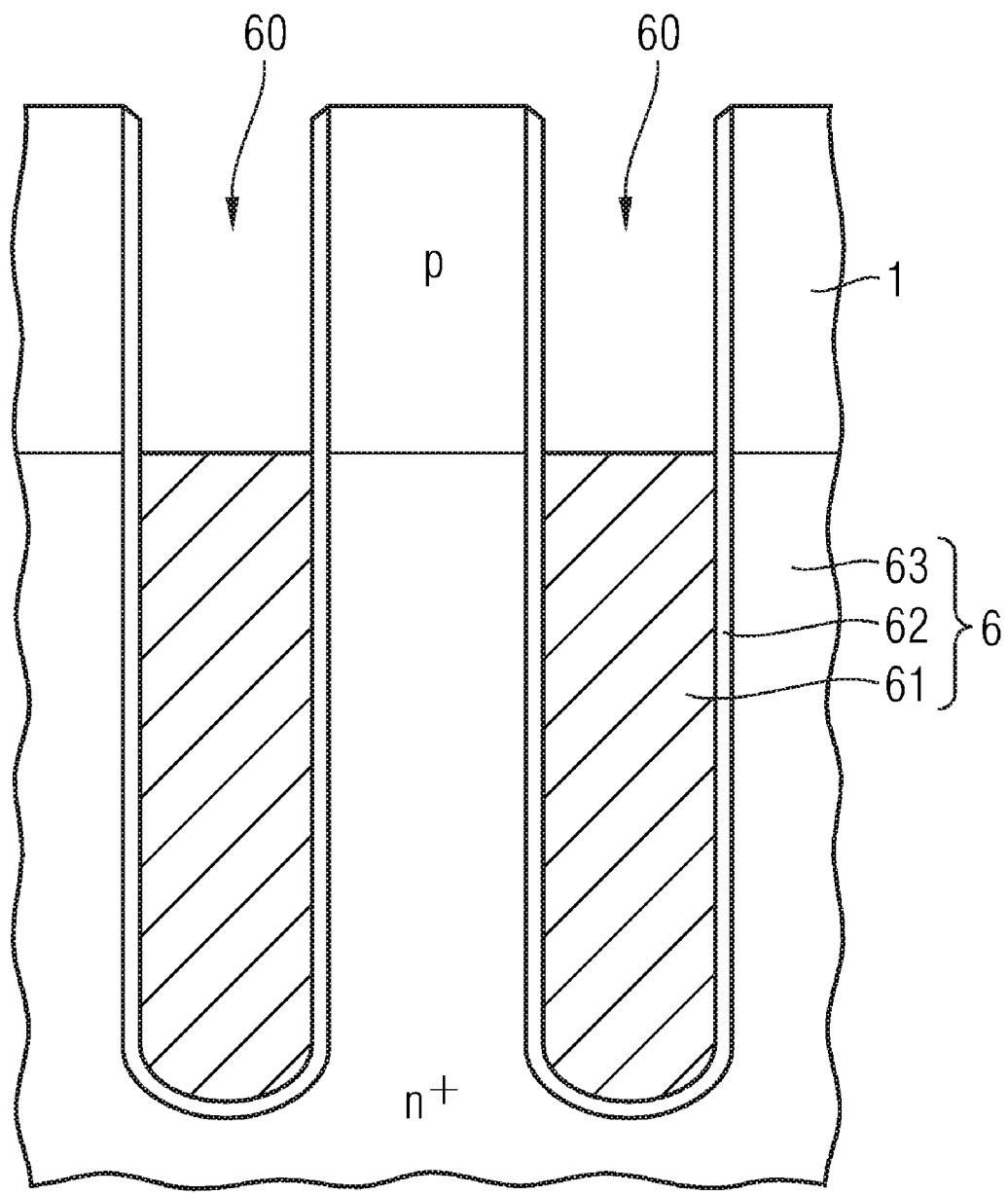

FIG. 4E schematically illustrates the trench capacitor 6 that has emerged from the method according to the invention.

Figure 5A:
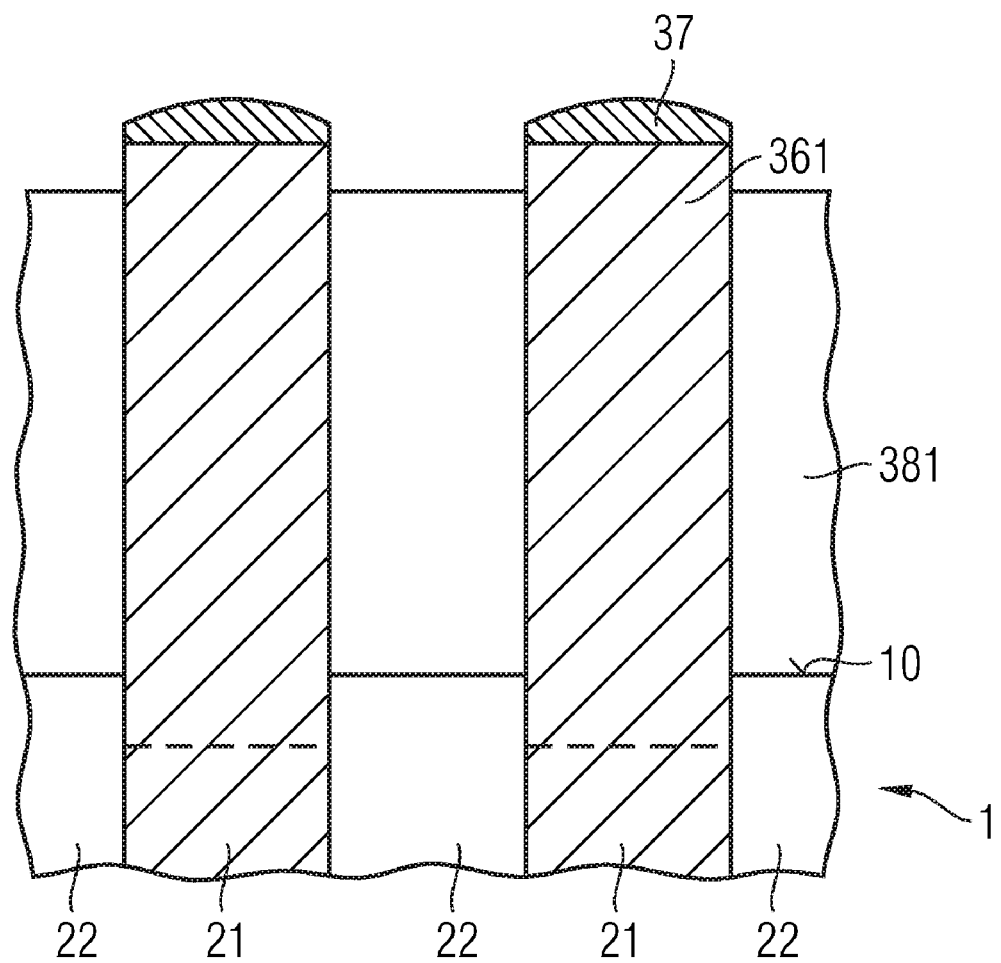
FIGS. 5A-5C illustrate the multi-stage formation of a mold layer having openings in accordance with a fifth embodiment of the method according to the invention on the basis of cross sections through the structure to be processed in different process phases.
Figure 5B:
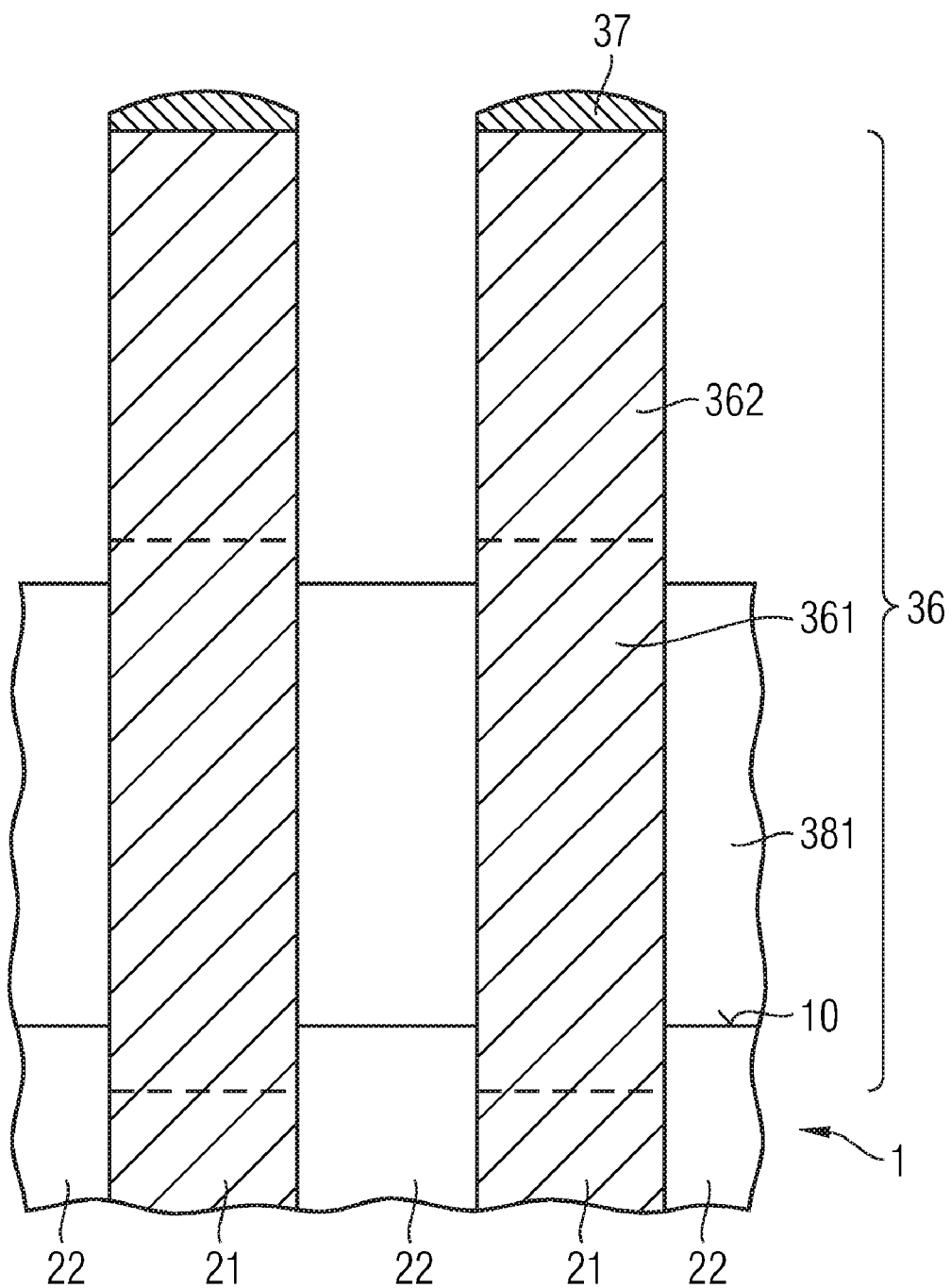
Figure 5C:
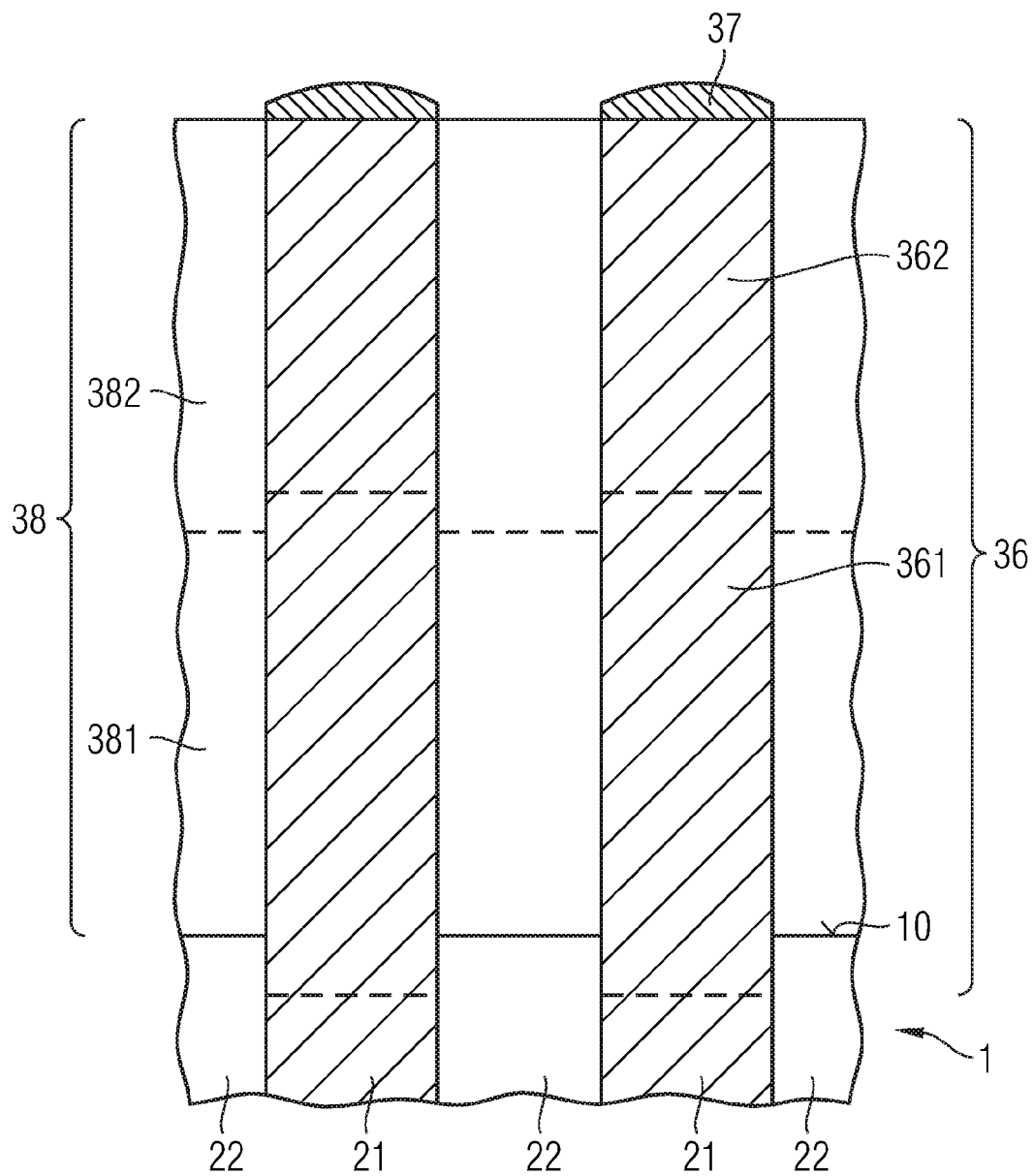

FIG. 5A to FIG. 5C relate to a multi-stage method for forming a mold layer having openings.

Following on from FIG. 1D, the growth of the silicon nanowires 36 is terminated after the silicon nanowires 36 have for example reached half of the height striven for. The supply of the precursor material is interrupted and/or the temperature is lowered below the eutectic temperature of the respective alloy melt. A first section 361 of the template pillar 36 to be grown is formed in this case. The first section 361 of the template pillar 36 is covered by a catalyst cap 37 composed of solidified catalyst material. A first section 381 of a mold layer bears on the substrate surface 10. The temperature is increased above the eutectic temperature again and the precursor material is supplied again. The silicon nanowires 36 start to grow further.

FIG. 5B illustrates a second section 362 of the template pillar 36, which second section has grown on the first section 361. The first section 381 of the mold layer stabilizes the silicon nanowires 36 during the deposition or the application of the second section 382 of the mold layer. The second section of the mold layer 382 is applied.

FIG. 5C illustrates the template pillars 36 embedded into a mold layer 38 that have emerged from the two-stage method. The alternation between growth of the silicon nanowire and deposition of the mold layer 38 can be repeated as often as desired. The length of the silicon nanowires 36 during the deposition of the mold layer 38 can thereby be reduced and the mechanical stability during the application of the mold layer 38 can be increased in this way.

Figure 6A:
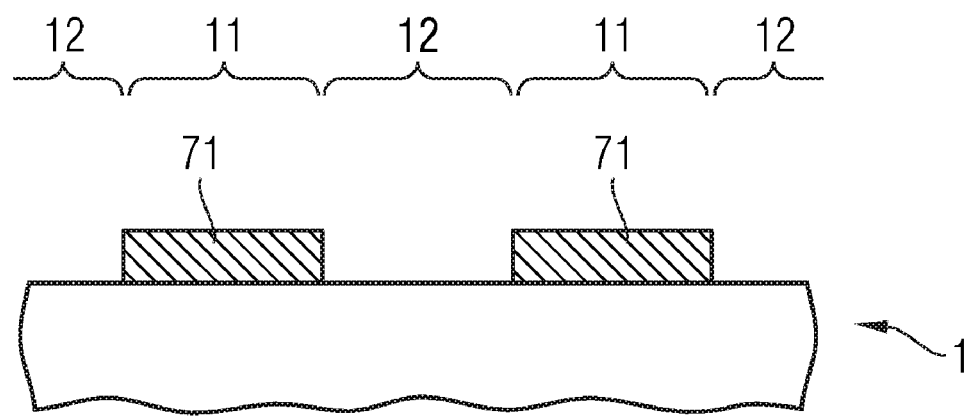
FIGS. 6A-6B illustrate a section of the formation of a mold layer having openings by using nanotubes on the basis of cross sections through the structure to be processed in different process phases in accordance with a sixth embodiment of the method according to the invention.
Figure 6B:
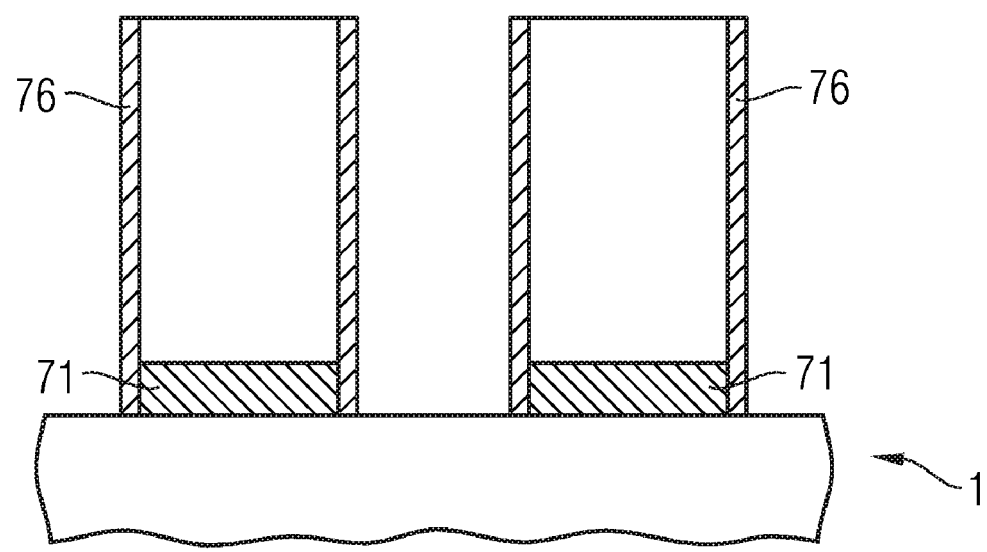

FIG. 6A and FIG. 6B relate to the shaping of template pillars by the growth of nanotubes 76.

Catalyst clusters 71 are patterned on a substrate surface 10 of a substrate 1 by using a damascene method or by a photolithographic method.

FIG. 6A illustrates the catalyst clusters 71 bearing on the substrate surface 1 in the first area sections 11. The catalyst clusters 71 are increased to a forming temperature of carbon nanotubes and carbon is supplied. The carbon is formed into nanotubes 76, which form template pillars 36, along the outer edges of the catalyst cluster 71. The further forming of a mold layer having an opening is effected analogously to the method processes outlined by FIGS. 1G to 1I.

FIG. 7A to FIG. 7G relate to a method for forming a mold layer having openings by a conductive layer (81) with guide openings (91).

Figure 7A:
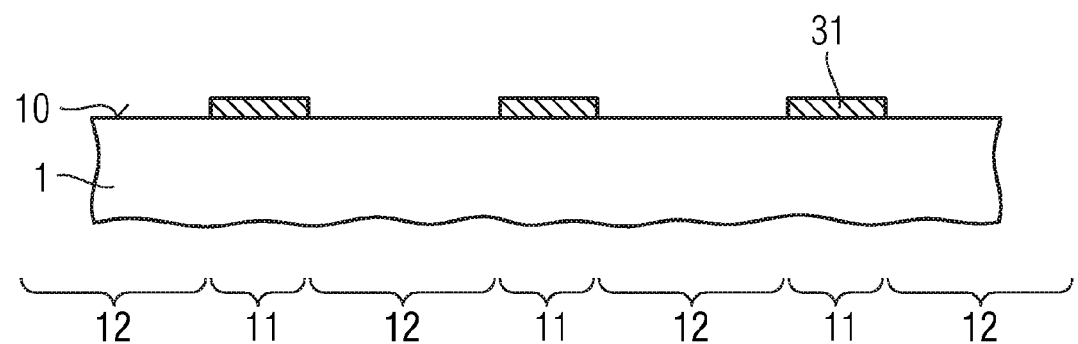
FIGS. 7A-7G illustrate the formation of a mold layer having openings by using a conductive layer and guide openings in accordance with a seventh embodiment of the method according to the invention on the basis of cross sections through the structure to be processed in different process phases.
Figure 7B:
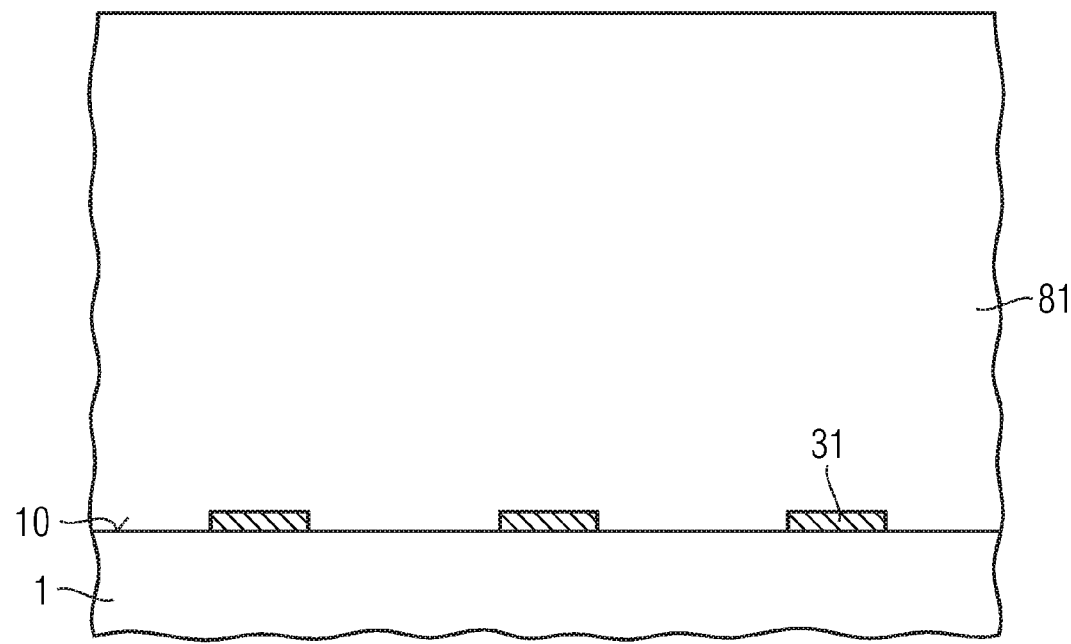
Figure 7C:
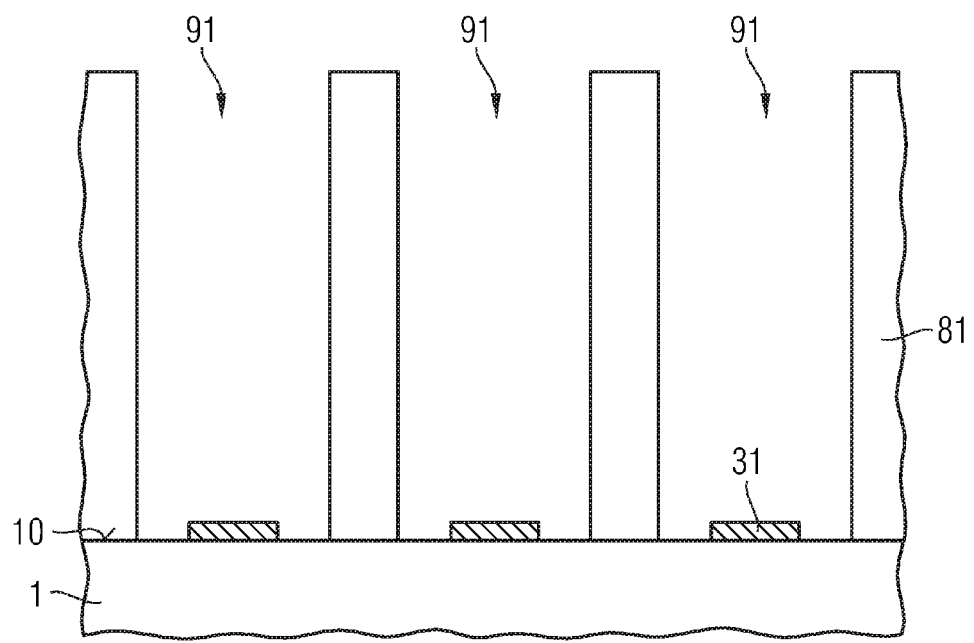

In accordance with FIG. 7A, catalyst clusters 31 are provided on first area sections 11 of a substrate surface 10 of a substrate 1, for instance of a monocrystalline silicon wafer. The catalyst clusters 31 are, for instance, circular or elliptical nickel discs having a diameter of 10 to 100 nanometers and a thickness of a few nanometers.

A layer having a thickness of up to a number of micrometers, for instance composed of a doped silicate glass, is deposited onto the catalyst clusters 31 and the second area section 12, for example by using a CVD process. The deposited layer forms a conductive layer 81, which, in accordance with FIG. 7B, covers the catalyst clusters 31 and the second area section 12.

Guide openings 91 having a circular or elliptical cross section are introduced into the conductive layer 81 by a photolithographic patterning method. In accordance with FIG. 7C, the diameter of the guide openings 91 is greater than that of the catalyst clusters 31. The guide openings 91 uncover the catalyst clusters 31 and in each case regions of the second area section 12 that adjoin them. Sections of the conductive layer 81 that remain between respectively adjacent catalyst clusters 31 form a precursor template with the guide openings 91 as pores.

Figure 7D:
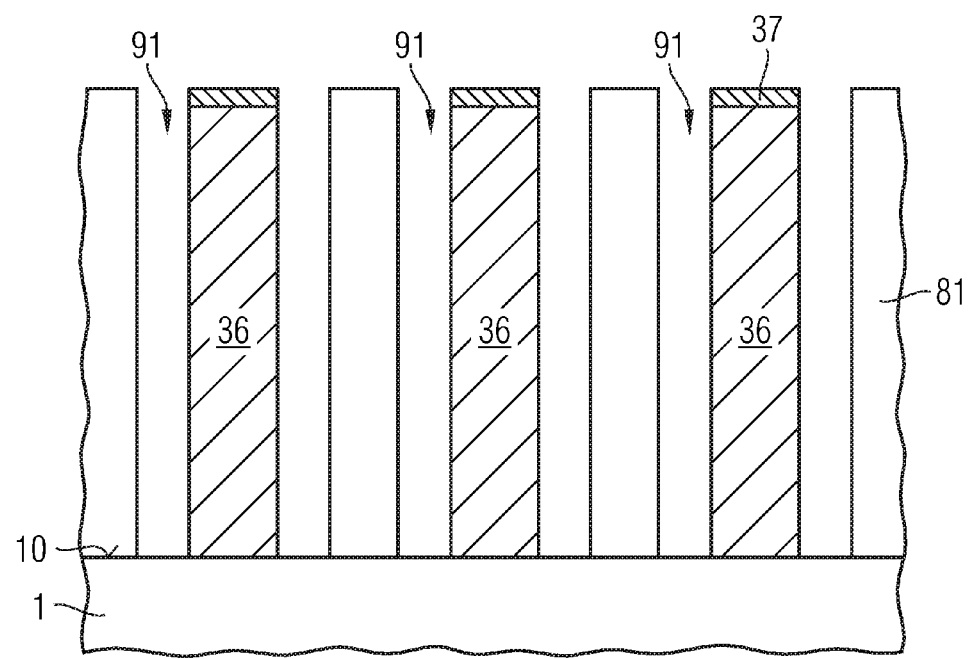

In accordance with FIG. 7D, silicon nanotubes are hereinafter grown as template pillars 36. The growing template pillars 36 are guided through the guide openings 91 and remain separate from one another. A crookedly growing template pillar 36 is prevented from leaning against an adjacent template pillar 36. The effect of a collapse of a template pillar 36 remains locally restricted.

Figure 7E:
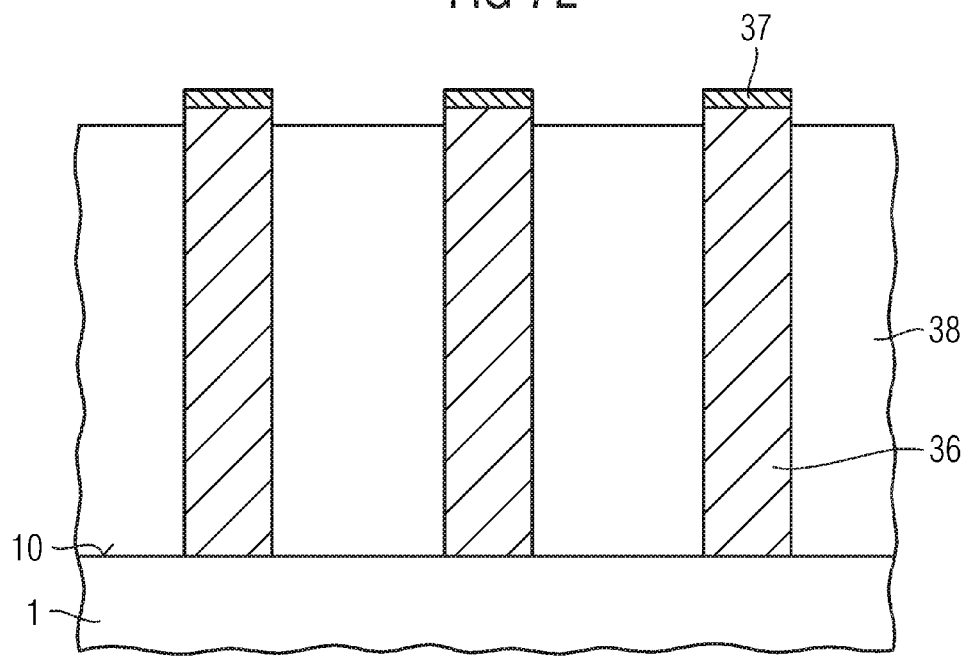

The mold layer 38 is formed in accordance with FIG. 7E by flowing of the conductive layer 81. In the case of doped silicate glass, the flowing is in this case effected by a thermal treatment (reflow) above approximately 600 degrees Celsius. After the thermal treatment, the silicate glass encloses the template pillars 36 in flush fashion and forms the mold layer 38. The mechanical loading on the template pillars 36 that is attributable to the formation of the mold layer 38 is comparatively low.

Figure 7F:
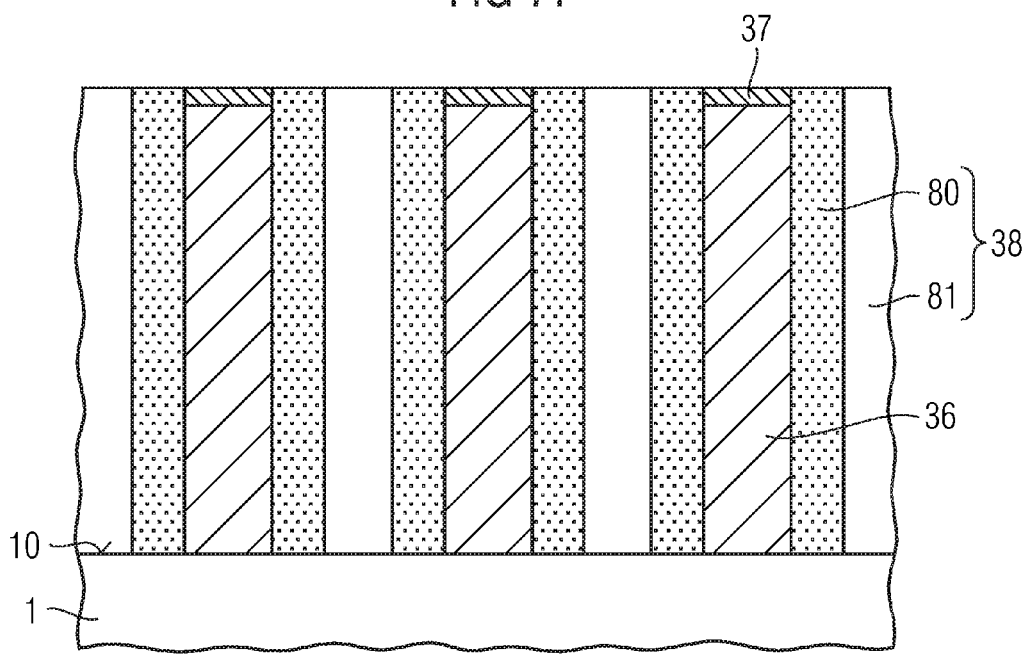

In accordance with FIG. 7F, the mold layer 38 is alternatively formed by filling the voids between the template pillars 36 and the conductive layer 81 within the guide openings 91 by using a filling material 80. The filling material 80 that fills the voids, together with the first conductive layer 81, forms the mold layer 38. The filling is effected for example by application of a spin-on dielectric by using spin-on coating. Filling material 80 that possibly covers the template pillars 36 is removed prior to the removal of the template pillars 36.

The methods of FIGS. 7E and 7F can also be combined. It is thus conceivable, for example, firstly to deposit a spin-on material which fills the interspaces only partly or with low density. The conductive layer 81 flows as a result of a subsequent thermal treatment. The mold layer 38 is formed from the conductive layer 81 and embedded portions of the filling material 80.

Figure 7G:
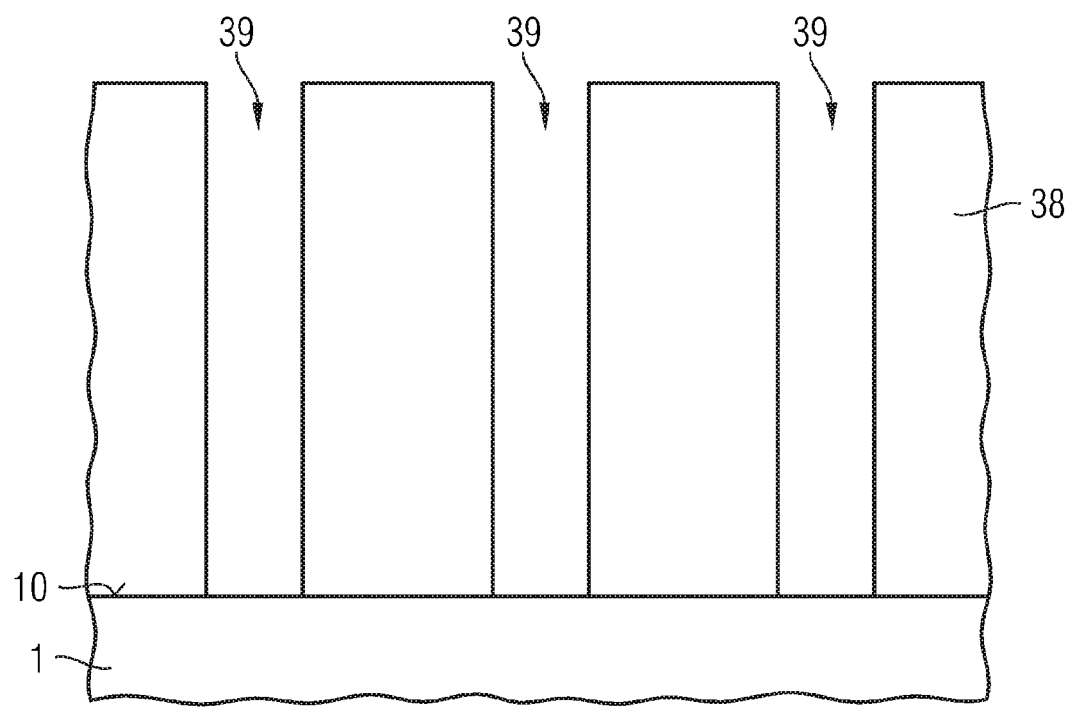

FIG. 7G follows on from FIG. 7F and illustrates the mold layer 38 with openings 39 that remains after the removal of the template pillars 36.

FIG. 8A to FIG. 8F relate to a two-stage method for forming a mold layer 38 with two subsets of guide openings (92, 93) as an example of a multi-stage method for forming the mold layer 38.

Figure 8A:
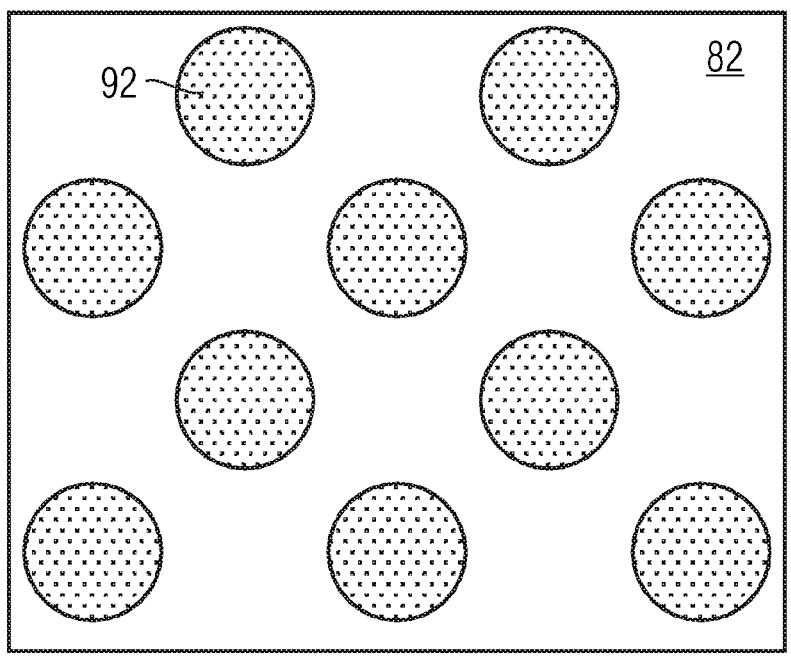
FIGS. 8A-8F illustrate the multi-stage formation of a mold layer by patterning of in each case a subset of guide openings and growth of respectively assigned template pillars, in accordance with a further embodiment of the method according to the invention on the basis of plan views of the structure to be processed in different process phases.

In accordance with FIG. 8A, a first subset of circular guide openings 92 are introduced into a conductive layer 82. The minimum distance (pitch) between two guide openings 92 corresponds for example to the minimum photolithographic resolution F for periodic structures of this type.

Figure 8B:
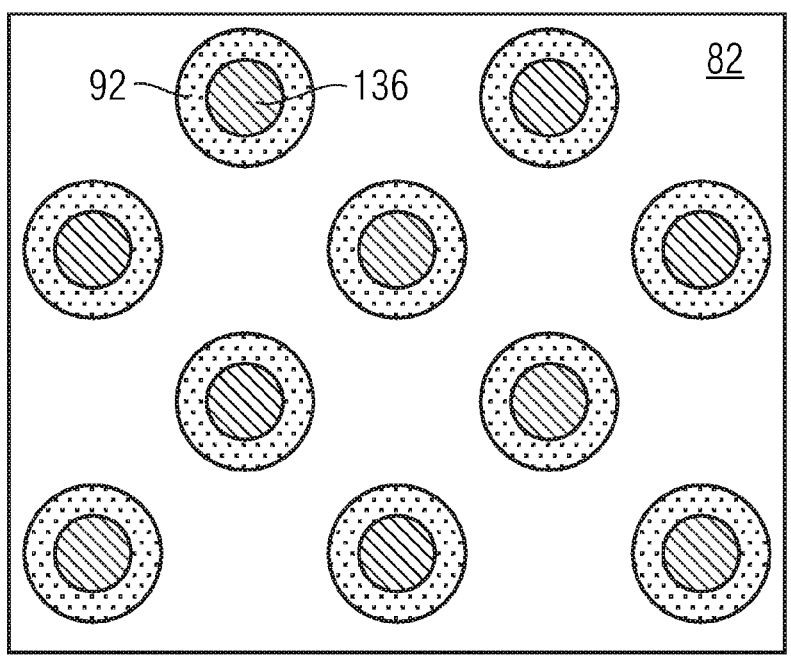
Figure 8C:
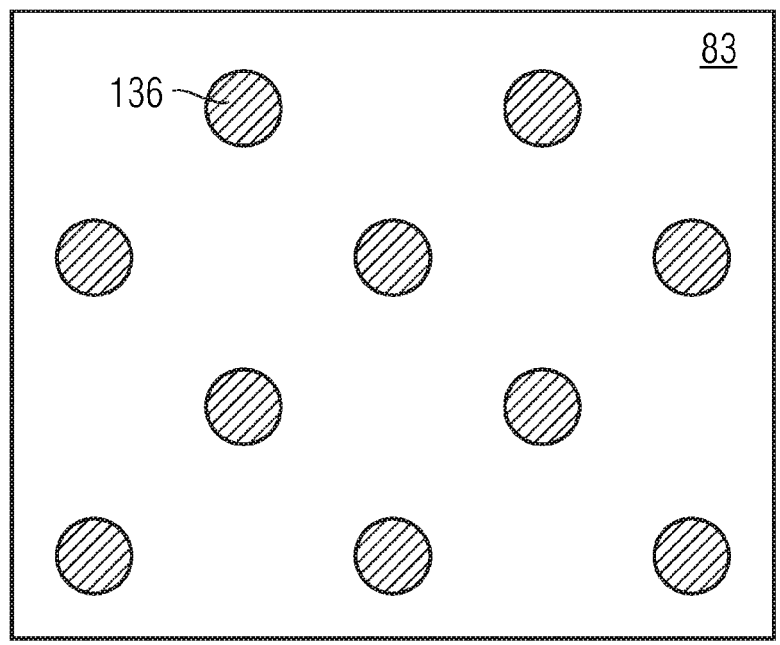

The guide openings 92 of the first subset support the directional growth of first template pillars 136 in accordance with FIG. 8B.

After a thermal treatment leading to flowing of the first conductive layer 82, a second conductive layer 83 has emerged from the first conductive layer 82. The first template pillars 136 form a half-template embedded into the second conductive layer 83 in accordance with FIG. 8C.

Figure 8D:
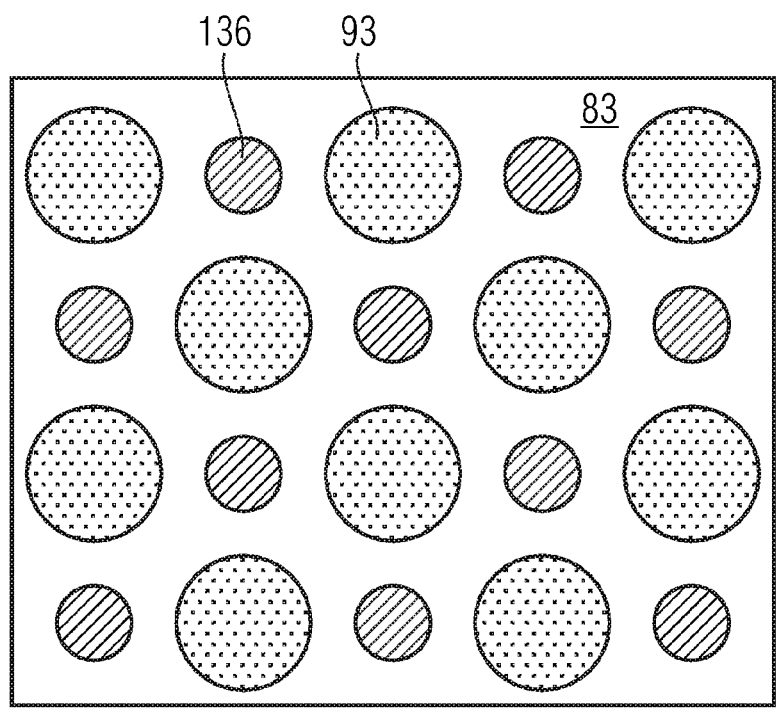

In accordance with FIG. 8D, a second subset of guide openings 93 are introduced into the second conductive layer 83 by a second photolithographic patterning method, the guide openings in each case being provided between the first template pillars 136.

Figure 8E:
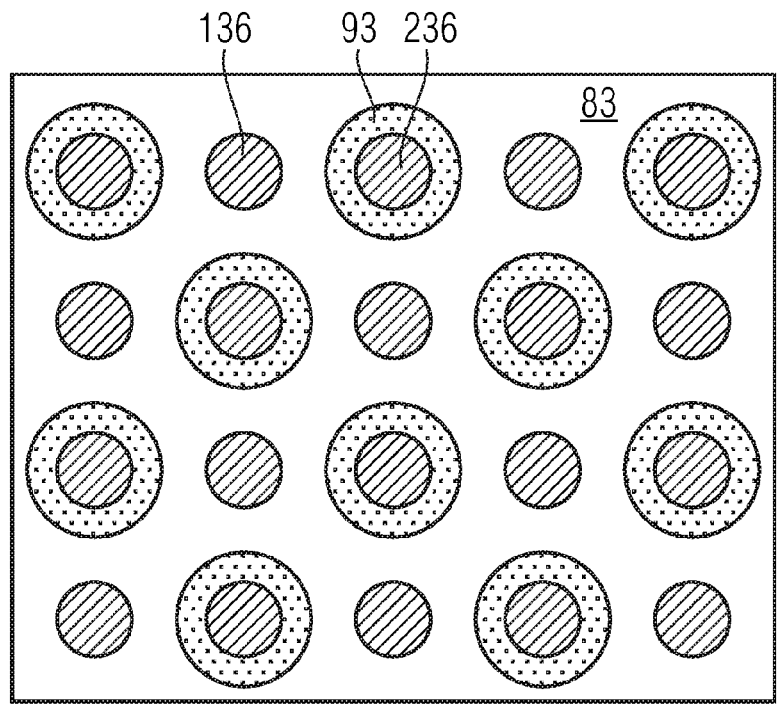
Figure 8F:
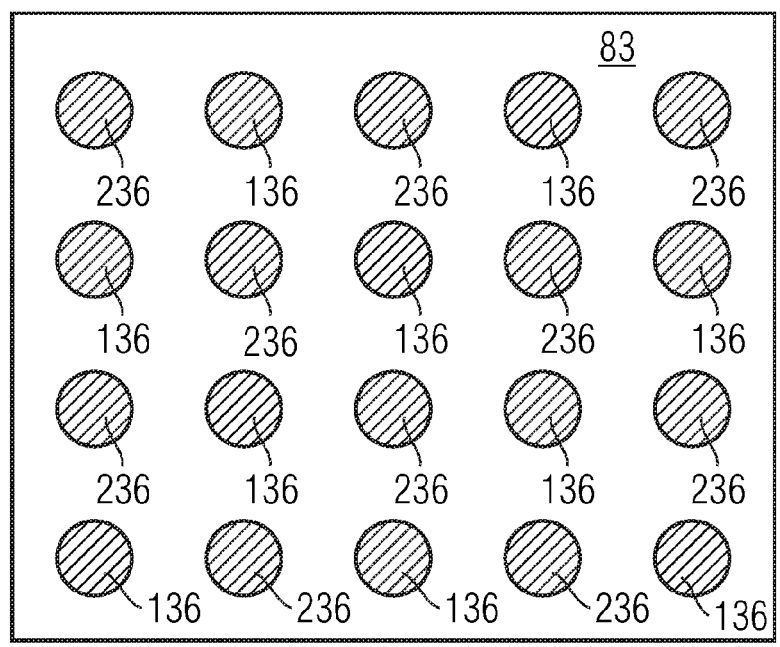

The guide openings 93 of the second subset guide the growing second template pillars 236 in accordance with FIG. 8E. The complete template composed of the first 136 and second 236 template pillars as illustrated in FIG. 8F results after the flowing of the second conductive layer 83 for forming the mold layer 38.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for forming an integrated circuit including a mold layer having an opening having a diameter of less than 500 nanometers, comprising:
   providing a substrate having a substrate surface with a first area section and a second area section;
   growing a vertical template pillar composed of a self-assembling stencil material in the first area section;
   forming the mold layer onto the second area section after the growth of the template pillar; and
   removing the template pillar after the application of the mold layer, the opening being formed in the mold layer over the first area section of the substrate;
   wherein the growth of the template pillar comprises:
   providing a catalyst cluster composed of a catalyst material on the first area section, the catalyst material being able to form a liquid alloy with the stencil material, upon the cooling of which liquid alloy the stencil material crystallizes out in pure form;
   melting of the catalyst material, the liquid alloy being formed from the stencil material and the catalyst material;
   supplying the stencil material, the liquid alloy being supersaturated with the stencil material and the stencil material growing on the first area section as a nanowire; and
   removing the catalyst material prior to the removal of the template pillar.

2. The method of claim 1, further comprising prior to the growth of the template pillar,
   applying an auxiliary layer to the substrate surface; and
   introducing a guide opening into the auxiliary layer, the first area section being uncovered and the cross section of the guide opening being greater than the cross section of the first area section, with the result that during the growth of the vertical template pillar, the growth can be guided by the sidewalls of the guide opening.

3. The method of claim 2, wherein the mold layer is formed by reflowing the material of the auxiliary layer after the growth of the template pillar, so that the template pillar is embedded in the mold layer after reflow.

4. The method of claim 2, wherein the mold layer is formed by filling the guide opening with a filling material which adjoins the template pillar, the filling material and auxiliary layer forms the mold layer.

5. The method of claim 1, wherein growing the template pillar and forming the mold layer is performed alternately in at least two iterations.

6. The method of claim 1, wherein growing the template pillar comprises providing silicon as stencil material and supplying silicon-containing material as precursor.

7. The method of claim 6, further comprising providing a material from a group comprising the elements Au, Fe and Al as catalyst material.

8. The method of claim 1, wherein the application of the catalyst material comprises:
   applying an auxiliary layer to the substrate;
   patterning the auxiliary layer, an auxiliary opening being formed in the auxiliary layer over the first area section; and
   filling the auxiliary opening with the catalyst material, the catalyst material forming a catalyst cluster in the auxiliary opening.

9. The method of claim 8, wherein the filling of the auxiliary opening comprises:
   depositing the catalyst material onto the auxiliary layer and into the auxiliary opening; and
   pulling back portions of the catalyst material that have been deposited outside the auxiliary opening by means of chemical mechanical polishing or dry etching.

10. The method of claim 1, wherein the application of the catalyst material comprises:
    applying a layer composed of the catalyst material to the substrate; and
    patterning the layer composed of the catalyst material by means of a photolithographic method, the catalyst material being preserved over the first area section and adjoining sections of the second area section and otherwise being removed.

11. The method of claim 1, wherein the mold layer is formed by a spin-on process.

12. The method of claim 1, wherein the template pillar is removed by a wet etching process.

13. The method of claim 1, wherein a plurality of openings is formed, the openings arranged equidistantly in each case in rows and columns and having a diameter of in each case less than 500 nanometers in the mold layer.

14. The method of claim 13, wherein a plurality of openings are formed and wherein forming the plurality of openings comprises:
    introducing a first subset of first guide openings into the auxiliary layer to expose a first subset of first area sections, growing first template pillars in the first guide openings;
    introducing a second subset of second guide openings into the auxiliary layer to expose a second subset of first area sections; and
    growing second template pillars in the second guide openings.

15. The method of claim 1, further comprising:
    applying a first electrode layer to the inner wall of the opening, the first electrode layer forming a storage electrode of the capacitor in sections;
    applying a dielectric layer to the first electrode layer, the dielectric layer forming a capacitor dielectric of the capacitor in sections; and
    applying a second electrode layer to the dielectric layer, the second dielectric layer forming a counter electrode of the capacitor in sections.

16. The method of claim 15, further comprising removing the mold layer prior to applying the dielectric layer.

17. The method of claim 1, further comprising:
    filling the opening with a conductive material, the conductive material forming a contact structure in the opening.

18. A method for forming an integrated circuit including a mold layer having an opening having a diameter of less than 500 nanometers, comprising:
    providing a substrate having a substrate surface with a first area section and a second area section;
    growing a vertical template pillar composed of a self-assembling stencil material in the first area section;
    forming the mold layer onto the second area section after the growth of the template pillar; and
    removing the template pillar after the application of the mold layer, the opening being formed in the mold layer over the first area section of the substrate;
    wherein the growth of the template pillar comprises:
    providing a catalyst cluster composed of a catalyst material on the first area section, the stencil material being able to form nanotubes in the vicinity of the catalyst material;

heating the catalyst cluster to a forming temperature at which the stencil material forms nanotubes in the presence of the catalyst material; and supplying the stencil material, the stencil material growing as nanotubes in the region of the first area section.

19. A method for forming an integrated circuit including a mold layer having an opening having a diameter of less than 500 nanometers, comprising:

providing a substrate having a substrate surface with a first area section and a second are section;

growing a vertical template pillar composed of a self-assembling stencil material in the first area section;

forming the mold layer onto the second area section after the growth of the template pillar; and removing the template pillar after the application of the mold layer, the opening being formed in the mold layer over the first area section of the substrate;

wherein the growth of the template pillar comprises:

forming a structural defect in the region of the first area section;

heating the substrate to a forming temperature;

supplying a gaseous starting substance of the stencil material, the stencil material sublimating selectively in the region of the structural defect at the forming temperature and growing as a nanowire.

20. The method of claim 19, wherein the staffing substance comprises zinc and oxygen.

* * * * *